US010185200B1

(12) United States Patent
Sprague et al.

(10) Patent No.: US 10,185,200 B1
(45) Date of Patent: Jan. 22, 2019

(54) THIN BORDER DISPLAYS

(71) Applicant: Amazon Technologies, Inc., Seattle, WA (US)

(72) Inventors: Robert Arthur Sprague, Saratoga, CA (US); Angeles Marcia Almanza-Workman, Sunnyvale, CA (US); Wilfrido Loor Canizares, San Francisco, CA (US); Siddharth Gupta, San Bruno, CA (US); Vikram Srinivas, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 21 days.

(21) Appl. No.: 15/191,390

(22) Filed: Jun. 23, 2016

Related U.S. Application Data

(63) Continuation-in-part of application No. 14/699,760, filed on Apr. 29, 2015, now Pat. No. 9,568,800.
(Continued)

(51) Int. Cl.
G02F 1/167 (2006.01)
H01L 27/12 (2006.01)
(Continued)

(52) U.S. Cl.
CPC ........ *G02F 1/167* (2013.01); *G02F 1/133305* (2013.01); *H01L 27/1214* (2013.01)

(58) Field of Classification Search
CPC ............... G02F 1/167; G02F 1/133305; G02F 2001/13613; G02F 2001/1678; G02F 1/1368; G02F 2001/1672; G02F 2001/1676; G02F 1/0102; G02F 1/1303; G02F 1/1333; G02F 1/13338; G02F 1/133553; G02F 1/1345; G02F 1/13452; G02F 1/13454; G02F 1/1347
(Continued)

(56) References Cited

U.S. PATENT DOCUMENTS 7,660,033 B2 * 2/2010 Uchida .................. G02F 1/167
345/107
2004/0180476 A1 9/2004 Kazlas et al.
(Continued)

OTHER PUBLICATIONS

Office action for U.S. Appl. No. 15/401,478, dated Mar. 22, 2018, Sprague, "Thin Border Displays", 12 pages.

*Primary Examiner* — Brandi N Thomas
(74) *Attorney, Agent, or Firm* — Lee & Hayes, PC

(57) ABSTRACT

A thin border display for an electronic device may comprise an optical assembly that includes a support frame and an electrophoretic display (EPD) structure attached to the support frame in a manner that allows for the display of the electronic device to exhibit a "thin border" or "borderless" look at a periphery of the electronic device. A portion of the EPD structure may at least partly curve around a curved portion of the support frame, the curved portion of the support frame being near the periphery of the support frame. In some embodiments, the EPD structure includes a transparent protective substrate disposed on a rear surface of a flexible backplane substrate within the flat outer region where a driver chip is disposed on a front surface of the flexible backplane substrate. The transparent protective substrate protects the driver chip attachment from being damaged during manufacture.

20 Claims, 19 Drawing Sheets

Related U.S. Application Data

(60) Provisional application No. 62/111,564, filed on Feb. 3, 2015.

(51) Int. Cl.
*G02F 1/1333* (2006.01)
*G02B 26/00* (2006.01)

(58) Field of Classification Search
USPC ............... 359/237, 242, 265–267, 270–273, 359/290–292, 295, 296, 298, 321, 322, 359/315
See application file for complete search history.

(56) References Cited

U.S. PATENT DOCUMENTS

| | | |
|---|---|---|
| 2012/0105370 A1 | 5/2012 | Moore |
| 2014/0192402 A1* | 7/2014 | Wu .......................... G02F 1/167 359/296 |
| 2015/0277199 A1 | 10/2015 | Chang et al. |

* cited by examiner

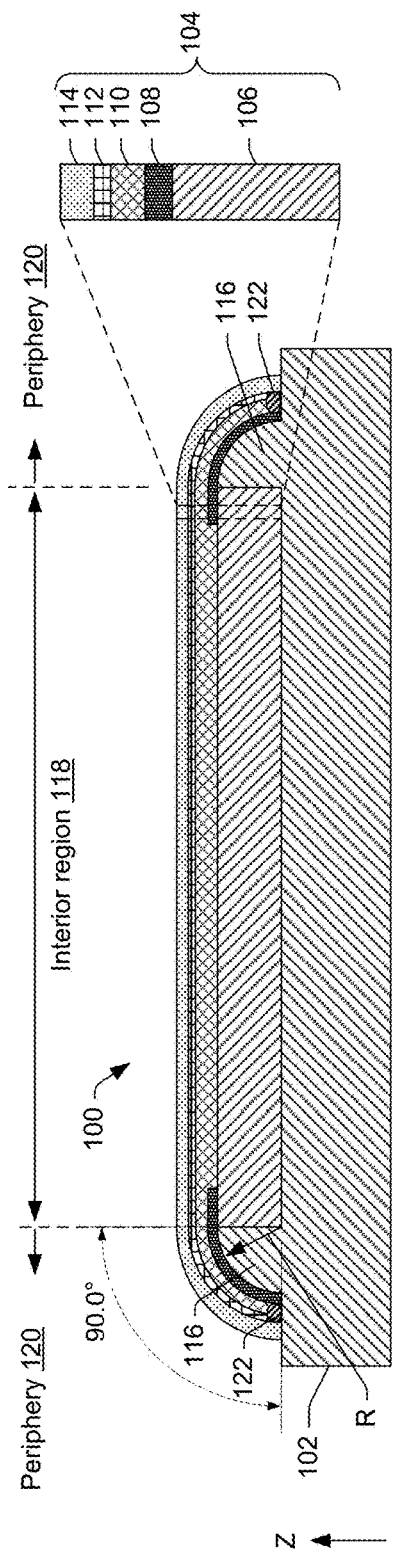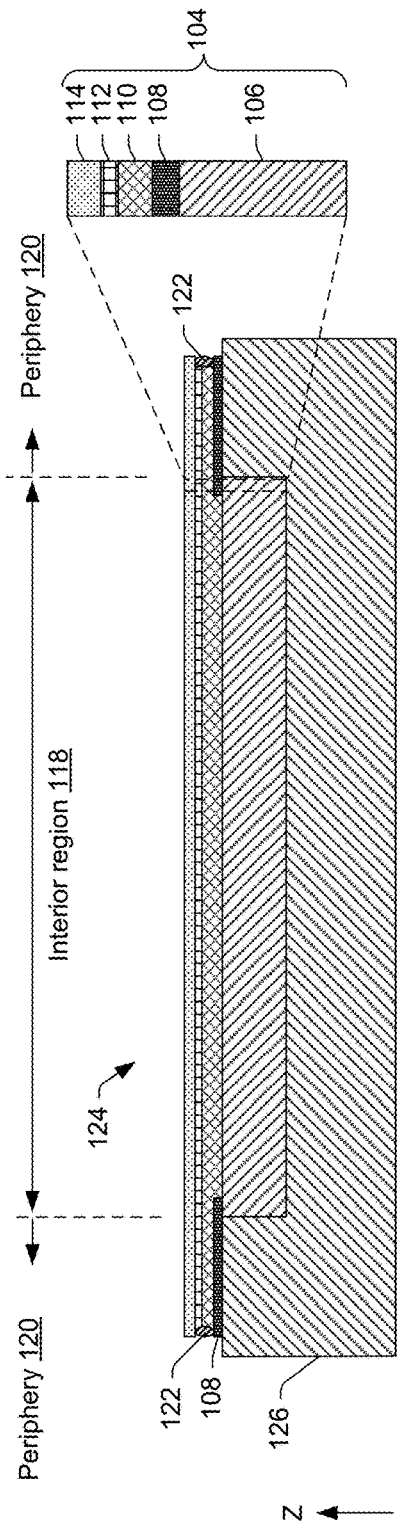

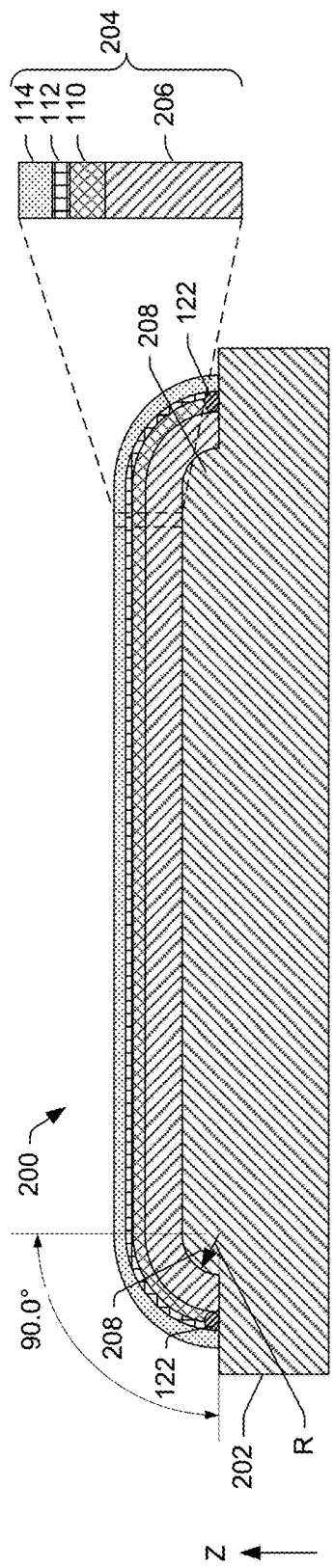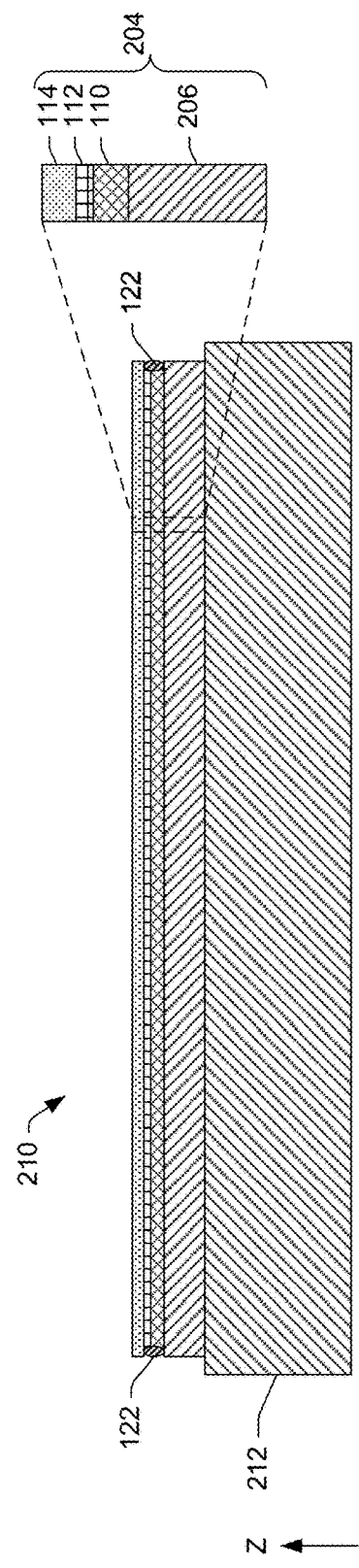

(SECTION A-A)

(SECTION A-A)

(SECTION A-A)

(VIEW B-B)

(VIEW C-C)

(VIEW D-D)

(Section E-E)

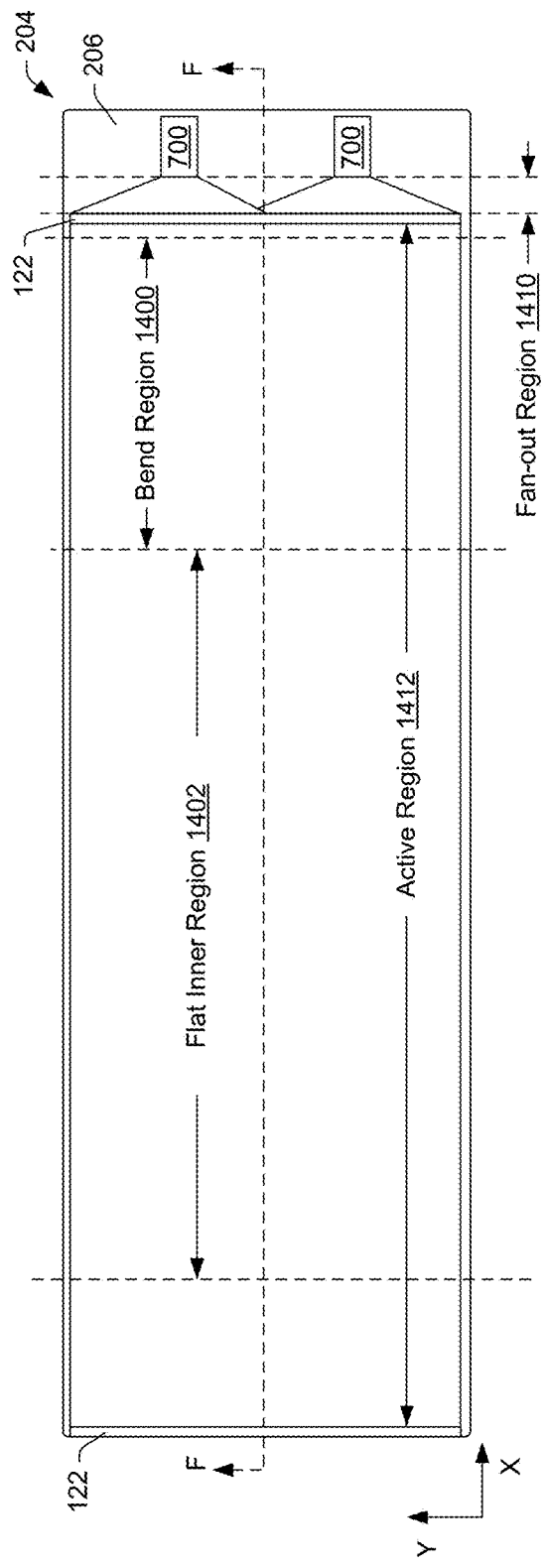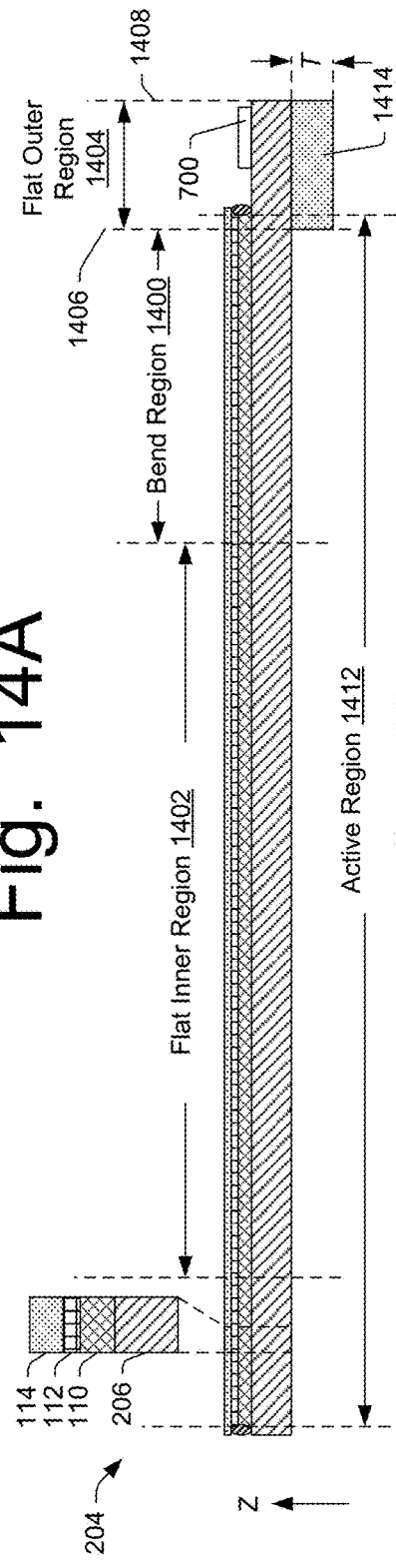
Fig. 14A
Fig. 14B
(Section F-F)

(SECTION E-E)

(Section F-F)

(Section E-E)

THIN BORDER DISPLAYS

CROSS REFERENCE TO RELATED APPLICATIONS

This application is a continuation-in-part of U.S. application Ser. No. 14/699,760, filed on Apr. 29, 2015, entitled "Thin Border Displays," which is based on and claims priority to U.S. Provisional Application No. 62/111,564, filed on Feb. 3, 2015, entitled, "Borderless Displays," the contents of which are herein incorporated by reference.

BACKGROUND

Electronic devices often include displays for presenting information to a user. In a given electronic device, the display is typically mounted within a housing that encloses various other components of the electronic device.

It can be challenging to design an electronic device that is thin, compact, and encloses all of the various components of the electronic device, including the display, within the housing. The existence of such design constraints causes the designs for many electronic devices to include a substantial border (or margin) on the front face of the device around the display such that the display area terminates at the border and does not extend any closer to, or around, the edges of the electronic device.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 1A illustrates a side, cross-sectional view of an example optical assembly for a thin border electrophoretic display of an electronic device.

FIG. 1B illustrates a side, cross-sectional view of another example optical assembly for a thin border electrophoretic display of an electronic device.

FIG. 2A illustrates a side, cross-sectional view of another example optical assembly for a thin border electrophoretic display of an electronic device.

FIG. 2B illustrates a side, cross-sectional view of another example optical assembly for a thin border electrophoretic display of an electronic device.

FIG. 14A illustrates a front view of an example an electrophoretic display structure showing various reference regions and components as seen from the front view.

FIG. 14B illustrates a side, cross-sectional view of the example electrophoretic display structure of FIG. 14A along section F-F according to one embodiment.

DETAILED DESCRIPTION

Figure 3A:
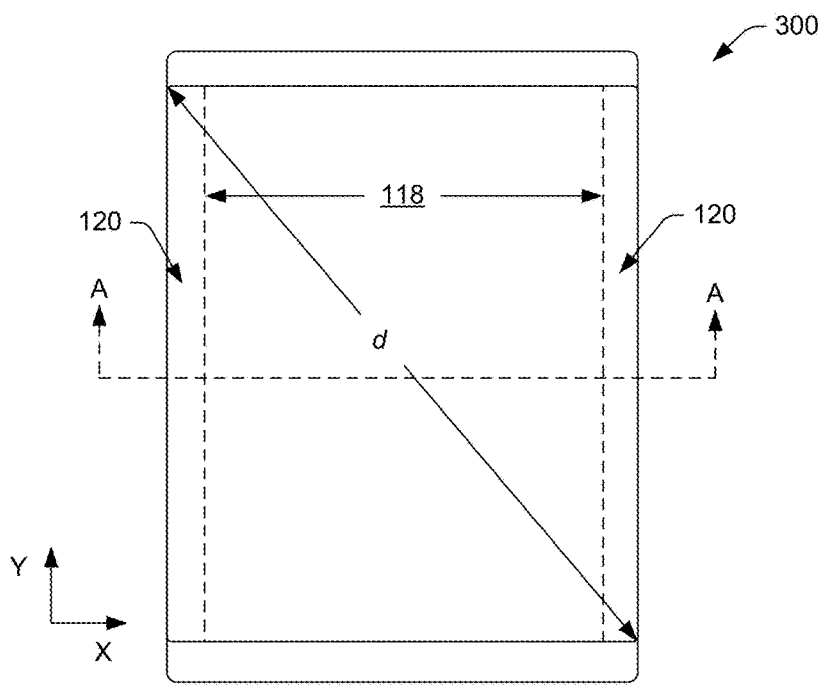
FIG. 3A illustrates a front view of an example electronic device having a two-sided thin border display.

Disclosed herein are thin border displays for electronic devices, and methods of manufacturing thin border displays. The disclosed thin border displays may be comprised of an optical assembly that includes a support frame and an electrophoretic display (EPD) structure attached to the support frame in a manner that allows for the display of the electronic device to exhibit a "thin border" or "borderless" look at a periphery of the electronic device. The thin border/borderless look may be enabled by a portion of the EPD structure being at least partly curved around a curved portion (e.g., a curved step) of the support frame, the curved portion of the support frame being near the periphery of the support frame. In some embodiments, the thin border/borderless look may be enabled by an electrode disposed at a periphery (in the margin) of the display to drive the margin region of the display closer to the edge of the device.

The EPD structure of the optical assembly may include a backplane substrate and an electrophoretic layer disposed on the backplane substrate. In some embodiments, the backplane substrate is rigid. In other embodiments, the backplane substrate is flexible. When the thin border display is implemented with a rigid backplane substrate, an electrode may be disposed in between the electrophoretic layer and the backplane substrate at a periphery of the electrophoretic layer and the backplane substrate. In this implementation, the electrode and electrophoretic layer may overhang the backplane substrate at one or more outer edges of the backplane substrate. The electrode is configured to drive the EPD where the electrophoretic layer extends beyond the backplane substrate. Moreover, the portion of the electrode and the electrophoretic layer that overhangs the outer edge(s) of the backplane substrate may be at least partly curved or flexed over, and attached to, a curved step of the support frame while the rigid backplane substrate remains flat on the support frame.

When the thin border display is implemented with a flexible backplane substrate, a periphery of the EPD structure (i.e., the flexible backplane substrate and the electrophoretic layer, at their respective peripheries) may extend close to the outer edge of the device, and may be at least partly curved or flexed over, and attached to, a curved step of the support frame while the central portion of the flexible backplane substrate remains flat on the support frame. In other embodiments, an electrode may be disposed in between the electrophoretic layer and the flexible backplane substrate at a periphery of the electrophoretic layer and the flexible backplane substrate.

The thin border displays described herein may improve user experience with electronic devices like electronic book readers (e-book readers) and tablets by making textual content look more like paper, giving the user an experience that is similar to viewing a tangible, hardcopy book, magazine, newspaper, or the like. The thin border display may also increase the display area on the electronic device by 10-25%, allowing for more content of the same size (e.g., font size) to fit on a single page, when presented on the display of the electronic device. As used herein, "thin border" may correspond to a border that is no greater than about 5 millimeters (mm).

The techniques, systems, and devices described herein may be implemented in a number of ways. Example implementations are provided below with reference to the following figures.

FIG. 1A illustrates a side, cross-sectional view of an example optical assembly 100 for a thin border electrophoretic display (EPD) of an electronic device. The structure 100 may comprise a support frame 102 that is configured to support an electrophoretic display (EPD) structure 104 (or "EPD stack 104") attached thereto. The support frame 102 may be made of any suitable material, such as acrylonitrile butadiene styrene (ABS) plastic, or another rigid, or semi-rigid, material suitable for electronic device housings, such as metal, carbon fiber, and so on.

The EPD structure 104 may comprise multiple layers, including, without limitation, a rigid backplane substrate 106, an electrode 108, an electrophoretic layer 110, a transparent conductive layer 112, and a transparent protective substrate 114. Adhesive layers may be interspersed between any or all pairs of adjacent layers in the EPD stack 104. In the embodiment of FIG. 1A, the rigid backplane substrate 106 comprises a rigid substrate. In this implementation, the rigid backplane substrate 106 may be made of any suitable rigid, or semi-rigid, material, such as glass or a polymer plastic material.

The EPD structure 104 may be a passive matrix drive type, an active matrix drive type, or a segmented-electrode direct drive type display. In any case, the rigid backplane substrate 106 is configured to provide an electric field to influence the movement of charged particles within the electrophoretic layer 110, which, in turn, causes an image to be formed on the display. That is, if an electrical signal is applied to an electrode on the surface of the rigid backplane substrate 106, an electric field may be generated between the rigid backplane substrate 106 and the transparent conductive layer 112 and/or between the electrode 108 and the transparent conductive layer 112. The generated electric field causes charged particles (e.g., white, black, grey, and/or colored particles) to move within the electrophoretic layer 110 so that an image can be generated on the display of the electronic device.

In the case of a passive matrix display, the rigid backplane substrate 106 may be patterned with a row electrode and the transparent conductive layer 112 may comprise a column electrode, or vice versa. In the case of an active matrix display, the rigid backplane substrate 106 may comprise a thin film transistor (TFT) array substrate comprising a pixel electrode(s), and the transparent conductive layer 112 may comprise a uniform transparent electrode, such as a uniform layer of indium tin oxide (ITO). In a segmented-electrode display configuration, segmented electrodes may be provided on a substrate, such as the rigid backplane substrate 106, and may each be driven independently with the desired voltage to give the desired optical state in a so-called "direct drive scheme"). In this implementation, the transparent conductive layer 112 may comprise a uniform transparent electrode. The rigid backplane substrate 106 may be disposed on a substantially flat portion or platform of the support frame 102 at a center of the support frame 102. The rigid backplane substrate 106 may also comprise a set of patterned electrodes with each electrode connected to its own driver, such as a segmented display.

The electrode 108 may be disposed on the rigid backplane substrate 106 at a periphery of the rigid backplane substrate 106, and the electrode 108 may extend beyond an outer edge of the rigid backplane substrate 106 such that the electrode 108 overhangs the outer edge of the rigid backplane substrate 106. In this manner, according to the example of FIG. 1A, the electrode 108 can be flexed over a curved step 116 of the support frame 102 and attached thereto. In some embodiments, the electrode 108 comprises a thin conductive foil electrode, such as a metal (e.g., aluminum) foil electrode, an electrode comprising metal (e.g., copper) nanowires, or an electrode made from a non-metal conductive material, such as graphite. The electrode 108 may have a thickness that is no greater than about 30 microns (or micrometers (μm)), no greater than about 25 microns, no greater than about 20 microns, no greater than about 15 microns, no greater than about 12 microns, no greater than about 10 microns, no greater than about 8 microns, no greater than about 6 microns, or no greater than about 4 microns.

As shown in FIG. 1A, the electrode 108 may not cover the surface of the rigid backplane substrate 106 at an interior region 118 of the optical assembly 100. During operation of the electronic device, this allows the rigid backplane substrate 106 to drive an addressable region of the display (i.e., the electrophoretic material in the electrophoretic layer 110 may be addressed with the rigid backplane substrate 106) where main text or content may be displayed, which corresponds to the interior region 118 of the display where the electrode 108 does not cover the rigid backplane substrate 106. In other words, the rigid backplane substrate 106 is configured to drive pixel information up to the edge of the inner edge of the electrode 108. The electrode 108 may be configured to drive the display at the periphery 120 (or margin area) of the display. In this manner, the periphery 120 of the display, instead of being addressable at the pixel level, may be driven by the electrode 108 to form any suitable image, indicia, or color in the periphery 120 of the display. For example, the electrode 108 may drive the periphery 120 to exhibit a white background, a black background, a shade of grey, or a colored background. In some instances, the background in the periphery 120 may be selected to match the background color of the interior region 118 of the display such that there is no perceivable demarcation or boundary between the interior region 118 and the periphery 120 of the display. The thickness of the electrode 108 and its ability to drive the periphery 120 facilitates a thin border appearance or even a borderless appearance on the display. In some embodiments, a dedicated pad on the front surface of the rigid backplane substrate 106 may drive the electrode 108 at the same time that the rigid backplane substrate 106 drives the pixel information in the addressable region.

The electrophoretic layer 110 may be disposed on the electrode 108 at the periphery 120 of the electrophoretic layer 110. As shown in FIG. 1A, the electrophoretic layer 110 may be flexible enough to bond to the surface of the rigid backplane substrate 106 within the interior region 118 notwithstanding the existence of the electrode 108 in between the rigid backplane substrate 106 and the electrophoretic layer 110. In some embodiments, a planarization layer may be interposed between the rigid backplane substrate 106 and the electrophoretic layer 110 within the interior region 118 to planarize the electrophoretic layer 110 where the electrophoretic layer 110 is not disposed on the electrode 108 (i.e., where the electrode 108 does not cover the rigid backplane substrate 106). In other embodiments, a first electrophoretic layer 110 may be disposed on the electrode 108, and a second, different electrophoretic layer may be disposed on the rigid backplane substrate 106 where the electrode 108 does not cover the rigid backplane substrate 106. In this case, the second electrophoretic layer may be of a different (i.e., greater) thickness than the electrophoretic layer 110 disposed on the electrode 108, and the two electrophoretic layers may abut each other at their respective edges.

The electrophoretic layer 110 may include a dielectric solvent (e.g., a high dielectric, low viscosity suspending medium) and charged particles dispersed throughout the dielectric solvent. The charged particles may be of different colors (e.g., a combination of white, black, and/or colored particles). White particles and color particles, or white particles and black particles, may move within the dielectric solvent in response to an electric field applied thereto. For a mono type EPD, which generates black and white images on the display, the electrophoretic layer 110 may contain white and black particles. For an EPD configured to generate colored images, the electrophoretic layer 110 may contain white and colored particles. In some embodiments, the electrophoretic layer 110 may have a thickness that is no greater than about 400 microns, no greater than about 350 microns, no greater than about 300 microns, no greater than about 300 microns, no greater than about 250 microns, no greater than about 200 microns, no greater than about 150 microns, no greater than about 120 microns, no greater than about 100 microns, no greater than about 80 microns, or no greater than about 60 microns.

The transparent conductive layer 112 may be disposed on the electrophoretic layer 110. The transparent conductive layer 112 may allow for an electric field to be generated upon driving the electrode of the rigid backplane substrate 106 with a driving voltage. The transparent conductive layer 112 may be patterned into columns or rows for a passive matrix display, or the transparent conductive layer 112 may be a uniform plate conductor without a pattern for an active matrix display. The transparent conductive layer 112 may comprise any suitable type of electrode, including, without limitation, ITO, carbon nanotubes, silver or copper nanowires, a metal mesh screen, and the like. Moreover, the "transparent" nature of the conductive layer 112 allows the transparent conductive layer 112 to be invisible to the naked eye.

The transparent protective substrate 114 may be disposed on the transparent conductive layer 112, and may protect the layers behind the transparent protective substrate 114. FIG. 1A shows that a portion of the EPD structure 104 is curved over the curved step 116 of the support frame, and that the curved portion of the EPD structure 104 makes a turn of about 90 degrees) (°) as the EPD structure 104 extends from the interior region 118 of the display where the EPD structure 104 is substantially flat to a termination point on a horizontally oriented face of the support frame 102 in the periphery 120, thereby forming a 90° elbow in the curved EPD structure 104. It is to be appreciated that, although FIG. 1A shows the EPD structure 104 making a turn of about 90° at the curved portion of the EPD structure 104, the EPD structure 104 may curve to a smaller or greater degree, such as by making a turn that is less than or greater than 90°. In one example, the curved portion of the EPD structure 104 makes a turn of about 180° where the EPD structure 104 terminates in a substantially horizontal orientation underneath the rigid backplane substrate 106 and within the support frame 102. The radius, R, of curvature of the curved portion of the EPD structure 104 may be no greater than about 7 mm, no greater than about 5 mm, no greater than about 3 mm, or no greater than about 1 mm, depending on the size of the electronic device. Various configurations will be described in more detail with reference to the following figures.

FIG. 1A further illustrates an edge seal 122 that is deposited in between the electrode 108 and the transparent protective substrate 114. The edge seal 122 may be comprised of any suitable resin material (e.g., Phenoxy Resin) that acts as a sealant against environmental contaminants. The edge seal 122 prevents oxygen and water vapor from damaging the electrophoretic material in the electrophoretic layer 110.

In general, the components and layers of the optical assembly 100, and of other structures shown in the following figures, may be considered to have front and rear surfaces that are oriented in the "Z-direction" of a three-dimensional Cartesian coordinate system (e.g., denoted by x, y, z). FIG. 1A shows how the support frame 102 and the multiple layers of the EPD structure 104 are stacked in the Z-direction such that each of the components and layers may be considered to have a front surface oriented in the positive Z-direction of FIG. 1A (i.e., closer to a viewing user), and a back surface oriented in the negative Z-direction of FIG. 1A (i.e., farther from a viewing user). It is to be appreciated that the various components and layers described herein may include surfaces that can be referenced in a similar manner.

FIG. 1B illustrates a side, cross-sectional view of another example optical assembly 124 for a thin border EPD of an electronic device, according to another embodiment. The optical assembly 124 (like the optical assembly 100 of FIG. 1A) may comprise a support frame 126 that is configured to support the EPD structure 104 that is attached thereto. The support frame 126 may be similar in material composition to the support frame 102 of FIG. 1A. However, the support frame 126 omits a curved step, like the curved step 116 of FIG. 1A.

In the example of FIG. 1B, the EPD structure 104 is attached to the support frame 126 in a substantially flat configuration, as opposed to the curved portion of the EPD structure 104 at the periphery 120 in the example of FIG. 1A. In this manner, the rigid backplane substrate 106 can be made of a relatively brittle material, such as glass, and still be far enough from the outer edge of the optical assembly 124 so that the rigid backplane substrate 106 is not as susceptible to breakage/fracture from dropping the electronic device. This is in contrast to extending the rigid backplane substrate 106 closer to the edge of the optical assembly 124 (e.g., extending it as far out as layers 108-114 extend in FIG. 1B), which may cause the rigid backplane substrate 106 to fracture more easily if the electronic device were to be dropped during use. In the example of FIG. 1B, the electrode 108 is configured to drive the display in the periphery 120 (or margin) of the display to facilitate a thin border appearance or a substantially borderless appearance to the display, as compared to displays without such an electrode 108 that provide a larger "non-displayable zone" between the edge of the device and the display (i.e., a smaller display for the same size device).

FIG. 2A illustrates a side, cross-sectional view of another example optical assembly 200 for a thin border electrophoretic display (EPD) of an electronic device, according to another embodiment. The optical assembly 200 (like the optical assemblies 100 and 124 of FIGS. 1A and 1B) may comprise a support frame 202 that is configured to support an electrophoretic display (EPD) structure 204 (or "EPD stack 204") that is attached thereto. The support frame 202 may be similar in material composition to the support frame 102 of FIG. 1A. The support frame 202 may also have a similar shape to that of the support frame 102 of FIG. 1A, with various differences in contours and features on the front face of the support frame 202.

The EPD structure 204 may comprise multiple layers, some of which may be similar to those described with reference to the EPD structure 104 of FIG. 1A, such as the electrophoretic layer 110, the transparent conductive layer 112, and the transparent protective substrate 114. In the example of FIG. 2A, the EPD structure 204 may include a backplane substrate 206 that is made of a flexible material, as opposed to the rigid backplane substrate 106 of FIG. 1A. Accordingly, the flexible backplane substrate 206 may be made of any suitable flexible material, such as, without limitation, polyamide (PA), polyimide (PI), polyethylene terephthalate (PET), polyethersulfone (PES), polycarbonate (PC), and the like. In this manner, the backplane substrate 206, being flexible, may be curved over a curved step 208 of the support frame 202 along with the other layers 110-114 of the EPD structure 204, which are also flexible. The radius, R, of curvature of the curved portion of the EPD structure 204 may be no greater than about 7 mm, no greater than about 5 mm, no greater than about 3 mm, or no greater than about 1 mm, depending on the size of the electronic device. The edge seal 122 may be deposited in between the flexible backplane substrate 206 and the transparent protective substrate 114 to seal the electrophoretic material in the electrophoretic layer 110 from environmental contaminants. In the example of FIG. 2A, the flexible backplane substrate 206 is configured to drive the display in the periphery 120 (or margin) of the display. In this manner, the optical assembly 200 creates a thin border appearance or even a borderless appearance for the display, and it does so by using a flexible backplane substrate 206, such as a flexible TFT array substrate, that offers addressability of the display at the pixel level all the way to the edge of the display.

FIG. 2B illustrates a side, cross-sectional view of another example optical assembly 210 for a thin border EPD of an electronic device, according to another embodiment. The optical assembly 210 (like the optical assemblies 100, 124, and 200 of FIGS. 1A, 1B, and 2A) may comprise a support frame 212 that is configured to support the EPD structure 204 that is attached thereto. The support frame 212 may be similar in material composition to the support frame 102 of FIG. 1A. Furthermore, the support frame 212 omits a curved step, like the support frame 126 of FIG. 1B.

In the example of FIG. 2B, the EPD structure 204 is attached to the support frame 212 in a substantially flat configuration, similar to the example of FIG. 1B. However, because the backplane substrate 206 is made of a relatively flexible (i.e., non-brittle) material, such as polyamide, the flexible backplane substrate 206 can be extended closer to the outer edge of the optical assembly 210 without the same susceptibility to breakage/fracture from dropping the electronic device as you would have with say a glass backplane. In this manner, the display can achieve a thin border appearance or a substantially borderless appearance.

In some embodiments, the flexible backplane substrate 206 may be implemented in a configuration similar to those shown in FIGS. 1A and 1B for the rigid backplane substrate 106. That is, a flexible backplane substrate 206 that is relatively smaller in size, as compared to the flexible backplane substrate 206 shown in FIGS. 2A and 2B, can be implemented with the electrode 108 shown in FIGS. 1A and 1B, where the electrode 108 may be disposed on the flexible backplane substrate 206 at a periphery of the flexible backplane substrate 206. In such a configuration, the electrode 108 may extend beyond an outer edge of the flexible backplane substrate 206 such that the electrode 108 overhangs the outer edge of the flexible backplane substrate 206. In this manner, the electrode 108 can be flexed over a curved step 116 of the support frame 102 and attached thereto, similar to the configuration shown in FIG. 1A. Alternatively, the EPD structure having the flexible backplane substrate 206 and the electrode 108 can remain substantially flat, similar to the configuration shown in FIG. 1B, and may extend close to the edge of the electronic device. In either configuration, the electrode 108 is configured to drive the display in the periphery 120 (or margin) of the display to facilitate a thin border appearance or a substantially borderless appearance to the display. Moreover, reducing the size of the flexible backplane substrate 206 in such a configuration may reduce the overall cost of the electronic device.

Figure 4:
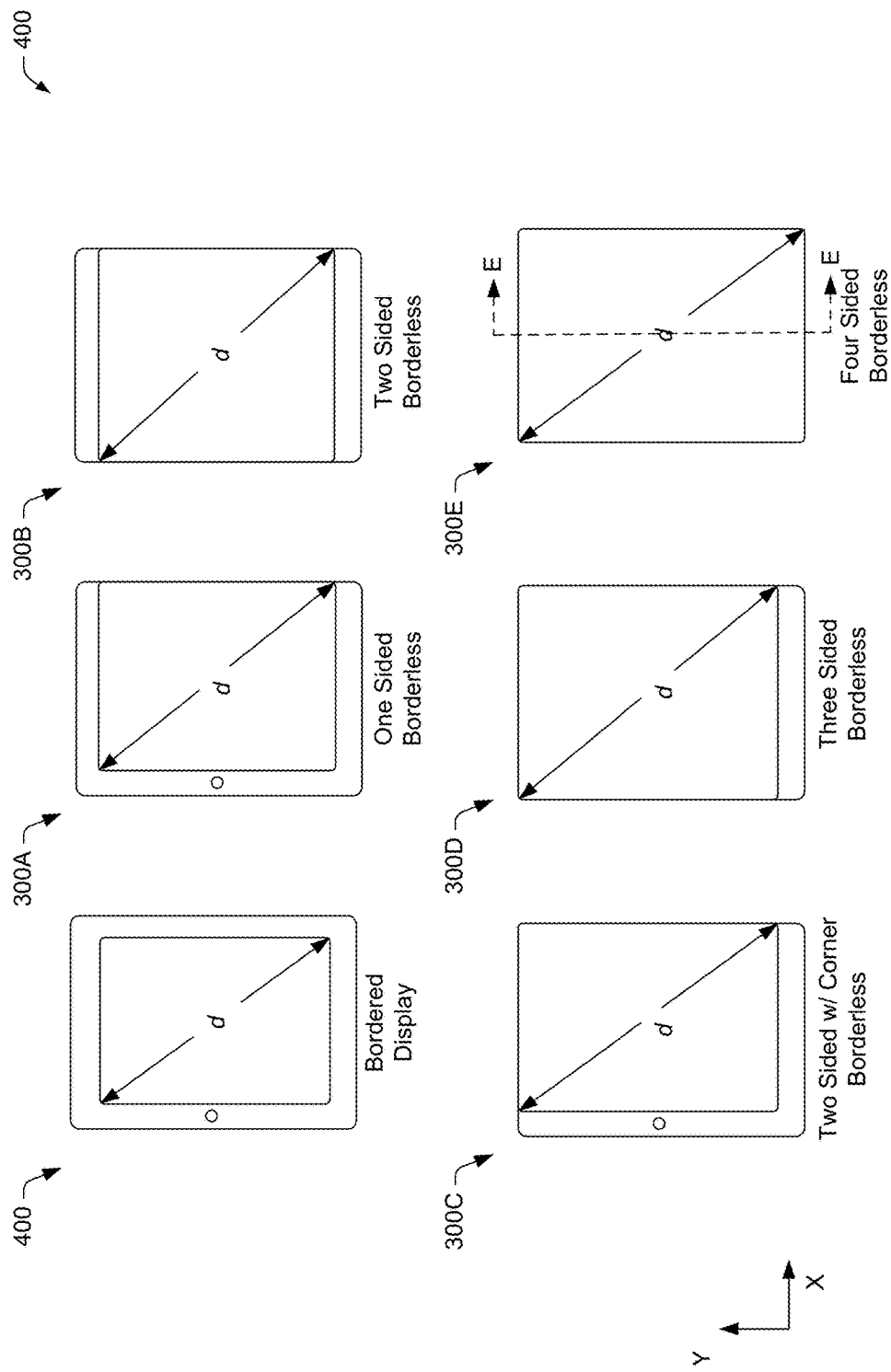
FIG. 4 illustrates example configurations for electronic devices having thin border displays.

FIG. 3A illustrates a front view of an example electronic device 300 having a two-sided thin border display. FIG. 3A shows that the front face of the electronic device 300 is oriented in the X-Y plane. The electronic device 300 may be any electronic device that provides a display, including, without limitation, a tablet computer, e-book reader, a smart watch or similar wearable computer with a display, a smart phone, a laptop or notebook computer, a desktop computer display, a television display, a wall mounted display, a panel display, an automobile display, a navigation device display (e.g., global positioning system (GPS) device display), a point of sale terminal display, an electronic sign, an automated teller machine (ATM) display, or any similar consumer or industrial electronic display device. FIG. 3A shows the electronic device 300 having a display screen size, d, as measured along the diagonal of the display. The display of the electronic device 300 may have an interior region 118 where the EPD structure 104/204 is substantially flat. The interior region 118 may correspond to a main content area (e.g., a main reading area where text-based content is rendered). The display of the electronic device 300 may accordingly have a periphery 120 where the EPD structure 104/204 is curved around a support frame, such as the support frame 102 or the support frame 202, of the electronic device 300. Although FIG. 3A shows an electronic device 300 having a two-sided thin border display (i.e., an EPD structure 104/204 that is curved over a curved step 116/208 of the support frame 102/202 at two opposing sides of the electronic device 300), the electronic device 300 may comprise any number of "thin border sides" on its display, such as one thin border side, two thin border sides, three thin border sides, or four thin border sides. Furthermore, in some implementations, at least two thin border sides may be adjacent to each other such that the EPD structure 104/204 wraps around a corner of the curved step 116/208 on the support frame 102/202. Various configurations of thin border displays are illustrated in FIG. 4.

Figure 3B:
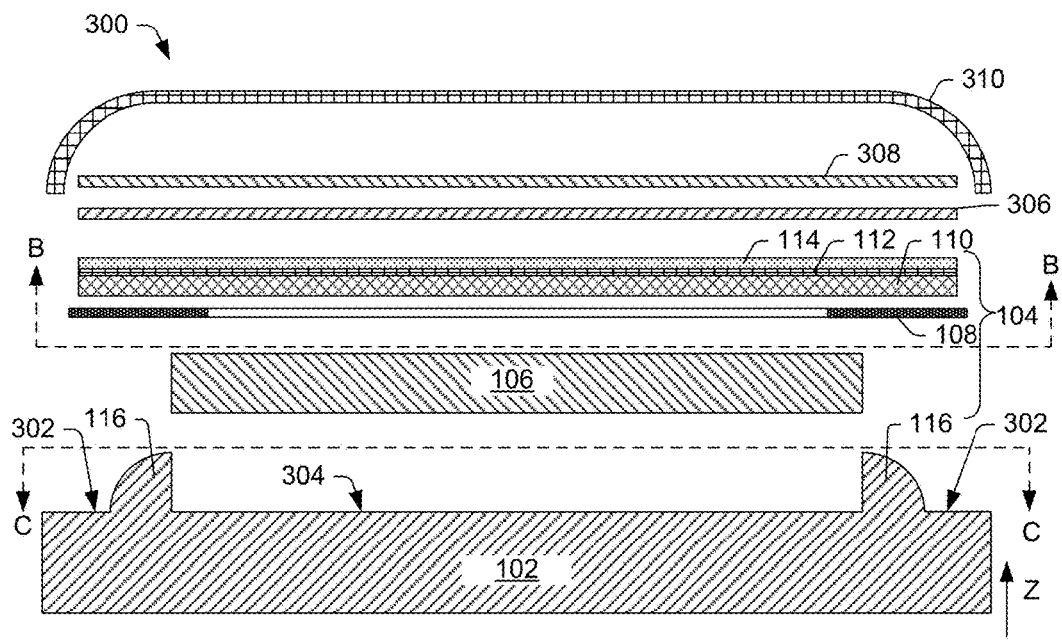
FIG. 3B illustrates a side, cross-sectional, exploded view of the example electronic device of FIG. 3A along section A-A according to one embodiment.

FIG. 3B illustrates a side, cross-sectional, exploded view of the example electronic device 300 of FIG. 3A along section A-A, according to one embodiment. The various layers that make up the display of the electronic device 300 are shown in FIG. 3B in their "pre-assembled" form where the layers to be curved over the curved step 116 of the support frame 102 are substantially planar, or flat, as would be the case prior to attachment of the EPD structure 104 to the support frame 102.

FIG. 3B illustrates many of the same components that were introduced in FIG. 1A, such as the support frame 102 having the curved step 116, as well as the EPD structure 104 comprising the rigid backplane substrate 106, the electrode 108, the electrophoretic layer 110, the transparent conductive layer 112, and the transparent protective substrate 114. Additionally, FIG. 3B illustrates that the support frame 102 may include a front face having a first platform 302 (or flat portion) that is located at a periphery of the support frame 102. In some embodiments, the first platform 302 extends around the entire periphery of the support frame 102. In other embodiments, the first platform 302 resides along at least one side of the support frame 102. The support frame 102 may further include a second platform 304 that is located at a center of the support frame 102. The curved step 116 is disposed in between the first platform 302 and the second platform 304. Although FIG. 3B depicts the first and second platforms 302 and 304 as being substantially coplanar (i.e., lying on the same plane or at the same vertical level in the Z-direction), the first platform 302 may be lower or higher than the second platform 304 in the Z-direction.

A rear surface of the rigid backplane substrate 106 is configured to be mounted upon the second platform 304. In the example of FIG. 3B, the level of the second platform 304 relative to the top of the curved step 116 is such that a recess is formed in the center of the support platform 102. The rigid backplane substrate 106 may sit within the recess defined by the second platform 304 and the curved step 116. Upon assembly, the additional layers 108-114 of the EPD structure 104 may be attached to the rigid backplane substrate 106 and the support frame 102, as is shown in FIG. 1A.

FIG. 3B further illustrates a light guide 306, a touch panel 308 (or "touch sensor 312")), and a cover lens 310. The light guide 306 may be disposed on the front surface of the EPD structure 104, and particularly on the front surface of the transparent protective substrate 114. The light guide 306 may be made of a flexible silicon material (e.g., silicon elastomer) so that the light guide 306 can be curved over the curved step 116 at the periphery 120 of the display. The light guide 306 is configured to guide light around the electrophoretic material of the EPD structure 104. The light guide 306 may have a thickness that is no greater than about 2 mm, no greater than about 1.5 mm, no greater than about 1 mm, no greater than about 0.5 mm, no greater than about 0.25 mm, no greater than about 0.2 mm, or no greater than about 0.1 mm.

The touch panel 308 may be disposed on the light guide 306, and may also be made of a flexible material, such as PET, or a similar transparent, flexible plastic. In this manner, the touch panel 308 can be curved over the curved step 116 at the periphery 120 of the display. The touch panel 308 may be configured to detect touch events on a front surface of the display of the electronic device 300 during operation of the electronic device 300. The touch panel 308 may have a thickness that is no greater than 1 mm, no greater than about 0.5 mm, no greater than about 0.25 mm, no greater than about 0.2 mm, no greater than about 0.1 mm, no greater than about 0.05 mm, or no greater than about 0.025 mm.

The cover lens 310 may be attached to the support frame 102, such as by attaching the cover lens 310 to the support frame 102 at the first platform 302. The cover lens 310 may enclose the EPD structure 104, the light guide 306, and the touch panel 308. The cover lens 310 may be made of glass or a hard plastic, such as PC, poly(methyl methacrylate), or a combination thereof, which is configured to protect the more fragile inner display components of the electronic device 300. The cover lens 310 may have a thickness that is no greater than about 4 mm, no greater than about 3.5 mm, no greater than about 3 mm, no greater than about 2.5 mm, no greater than about 2 mm, no greater than about 1.5 mm, or no greater than about 1 mm. The cover lens 310 may be formed in a pre-molded configuration in a separate manufacturing process so that it is already curved upon assembling the electronic device 300. Layers 104, 306, and 308 may be laminated together and then curved to contour with the curved step 116, or layers 104, 306, and 308 may be laminated onto the rear surface of the curved cover lens 310 and then attached to the support frame 102.

Figure 3C:
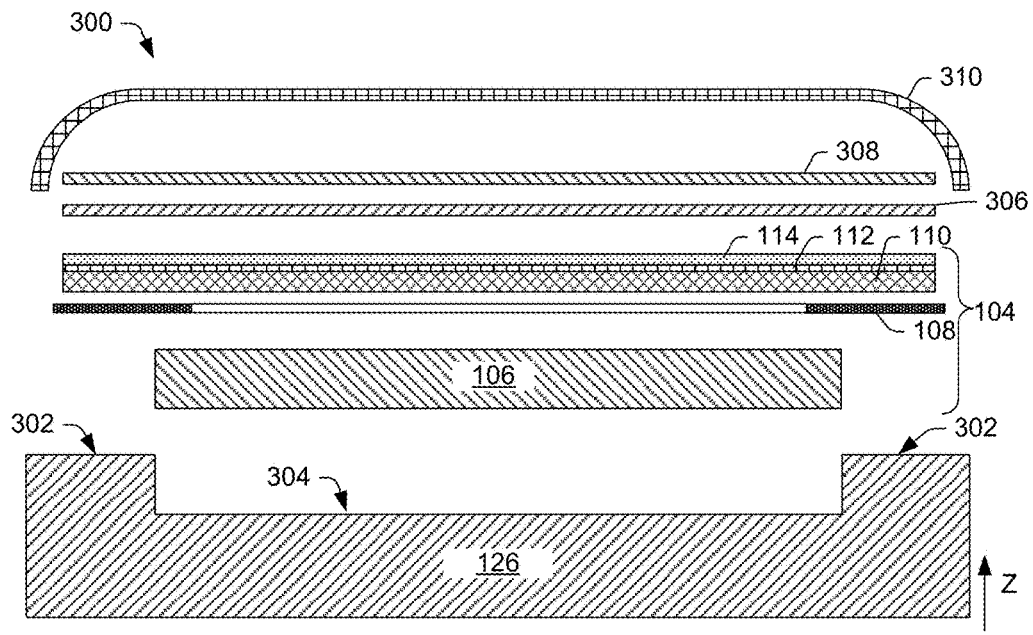
FIG. 3C illustrates a side, cross-sectional, exploded view of the example electronic device of FIG. 3A along section A-A according to another embodiment.

FIG. 3C illustrates a side, cross-sectional, exploded view of the example electronic device 300 of FIG. 3A along section A-A according to another embodiment. Like FIG. 3B, the various layers that make up the display of the electronic device 300 are shown in FIG. 3C in their pre-assembled form. FIG. 3C illustrates many of the same components that were introduced in FIG. 1B, such as the support frame 126 and the EPD structure 104 comprising the rigid backplane substrate 106, the electrophoretic layer 110, the transparent conductive layer 112, and the transparent protective substrate 114. FIG. 3C further illustrates the light guide 306, the touch panel 308 (or "touch sensor 308")), and the cover lens 310 introduced with reference to FIG. 3B.

The support frame 126 of FIG. 3C may include front face having a first platform 302 that is located at a periphery of the support frame 126. The support frame 126 may further include a second platform 304 that is located at a center of the support frame 126. In this manner, the support frame 126 may comprise a similar configuration to the support frame 102 with regard to the first platform 302 and the second platform 304, yet the support frame 126 omits a curved step, such as the curved step 116 of the support frame 102. This is because the optical assembly in FIG. 3C is to remain substantially flat when assembled, as shown in FIG. 3D.

Figure 3D:
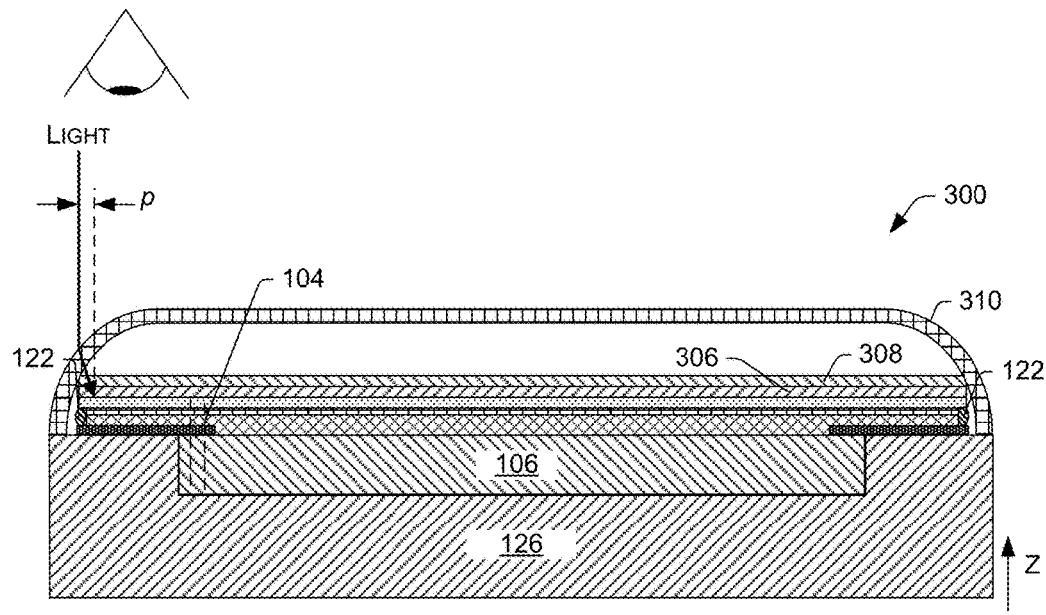
FIG. 3D illustrates a side, cross-sectional view of the example electronic device of FIG. 3C in assembled form.

FIG. 3D illustrates a side, cross-sectional view of the example electronic device 300 of FIG. 3C in assembled form. As shown in FIG. 3D, a rear surface of the rigid backplane substrate 106 is disposed upon the second platform 304 of the support frame 126. The layers 104, 306, and 308 may be laminated together and coupled to the support frame 126, or layers 104, 306, and 308 may be laminated onto the rear surface of the curved cover lens 310 and then attached to the support frame 126.

FIG. 3D further illustrates how the curved cover lens 310 is configured to obscure any given border surrounding the display by optical redirection. That is, in the implementation where the EPD structure 104 remains substantially flat upon assembly, the EPD structure 104 may run up to the edge of the electronic device 300, but a thin border remains around the EPD structure 104 at the edge of the device 300. The border around the substantially flat EPD structure 104 may be on the order of about 1 mm due to the width of the edge seal 122 that seals the electrophoretic layer 110. However, the curved cover lens 310 is configured to refract incoming light rays to create an offset, p, from the perspective of a person viewing the display from the front of the electronic device 300. In this manner, the offset, p, causes the person viewing the display from the front to actually see a point on the display that is a distance, p, inside the edge of the device 300, causing a thin border appearance or a borderless appearance from the perspective of the viewer. In some embodiments, the offset, p, is about 1 mm. In some embodiments, the cover lens 310 is an optically clear (i.e., substantially transparent) material, such as clear glass or plastic. In other embodiments, the cover lens 310 may be frosted near the periphery 120 of the display to further obscure any actual border that remains around the EPD structure 104 in the flat configuration shown in FIGS. 3C and 3D.

Although FIGS. 3C and 3D illustrate a cover lens 310 that is curved, the cover lens 310 is not limited to being curved, and may instead be substantially flat according to some embodiments. With a flat cover lens 310, any thin border around the EPD structure 104 may be more perceivable to a viewer. As noted above, however, the flat cover lens 310 may be frosted around the periphery 120 of the display to help obscure any perceivable border.

Figure 3E:
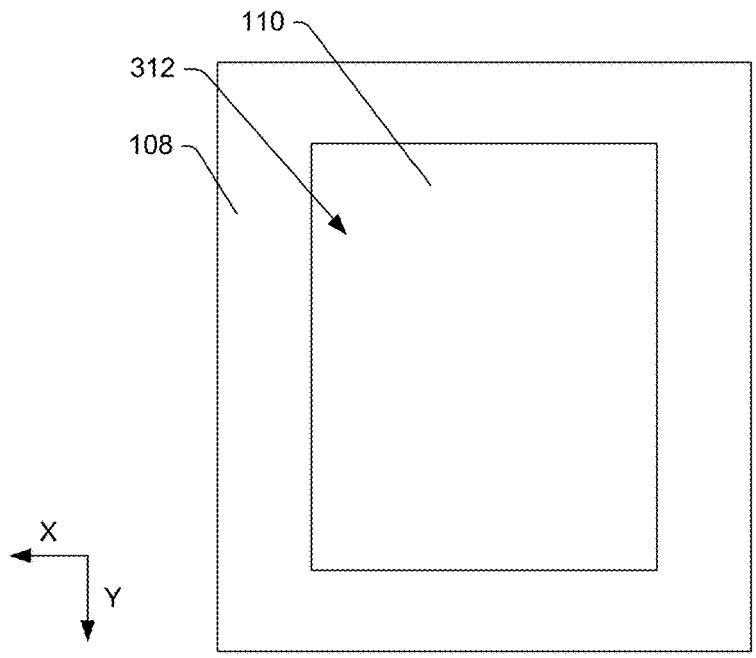
FIG. 3E illustrates a rear view of an example electrode and an example electrophoretic layer shown in FIG. 3B as seen from view B-B.

FIG. 3E illustrates a rear view of an example electrode 108 and an example electrophoretic layer 110 shown in FIG. 3B as seen from view B-B. The electrode 108 is shown as having a rectangular shape, and including a window 312 in a center region of the electrode 108 that is void of material. The electrode 108 may be of any polygonal shape, and the particular shape may depend on the shape of the electronic device 300 in which the electrode 108 is implemented. The window 312 allows for the charged particles in the electrophoretic layer 110 to be influenced by the electric field produced by the rigid backplane substrate 106 (e.g., a TFT array substrate) in the interior region 118 of the display, while the electrode 108 can drive the electrophoretics in the periphery 120 (or margin) of the display. Although the electrode 108 is depicted in FIG. 3E as a four sided, rectangular frame, the electrode 108 may comprise a single strip along a single side of the electrophoretic layer 110, or the electrode 108 may comprise two independent strips of thin metal at opposing sides of the electrophoretic layer 110, or the electrode 108 may comprise a U-shaped strip of metal on three contiguous sides of the electrophoretic layer 110.

Figure 3F:
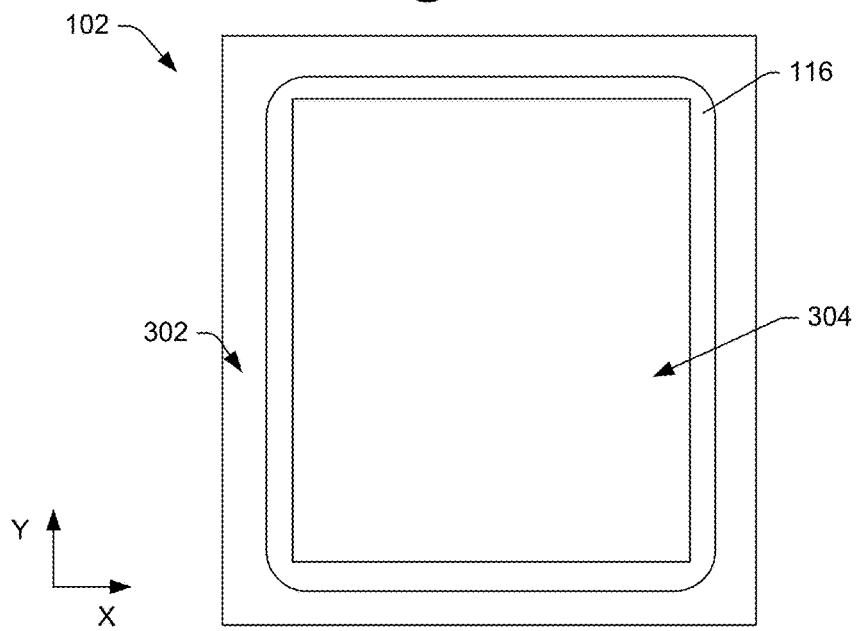
FIG. 3F illustrates a front view of an example support frame shown in FIG. 3B as seen from view C-C.

FIG. 3F illustrates a front view of an example support frame 102 shown in FIG. 3B as seen from view C-C. FIG. 3F shows that the support frame 102 may include a curved step 116 that is positioned in between the first platform 302 and the second platform 304. In some embodiments, the curved step 116 is a continuous feature that surrounds the entire second platform 304, as shown in FIG. 3F, which may allow for a four sided thin border display. However, it is to be appreciated that, in some implementations, the curved step 116 may extend along a single side of the support frame 102, along two opposing sides of the support frame 102, or along two or three adjacent or contiguous sides of the support frame 102.

Figure 3G:
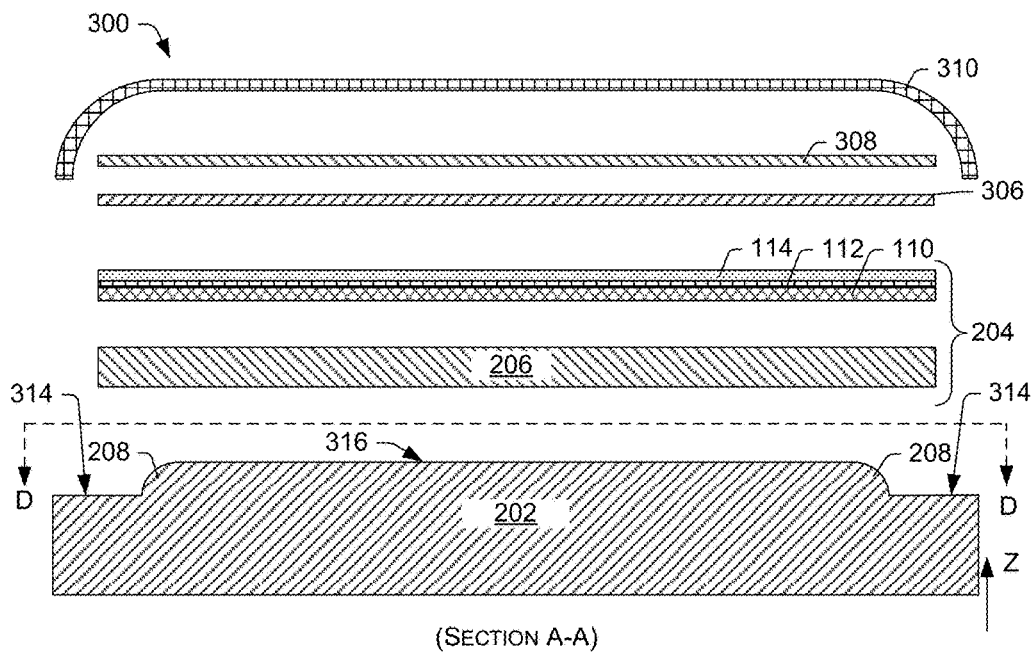
FIG. 3G illustrates a side, cross-sectional, exploded view of the example electronic device of FIG. 3A along section A-A according to another embodiment.

FIG. 3G illustrates a side, cross-sectional, exploded view of the example electronic device 300 of FIG. 3A along section A-A according to another embodiment. Like FIG. 3B, the various layers that make up the display of the electronic device 300 are shown in FIG. 3G in their pre-assembled form where the layers to be curved over the curved step 208 of the support frame 202 are substantially planar, or flat, as they would be prior to attachment to the support frame 202.

FIG. 3G illustrates many of the same components that were introduced in FIG. 2A, such as the support frame 202 having the curved step 208, as well as the EPD structure 204 comprising the flexible backplane substrate 206, the electrophoretic layer 110, the transparent conductive layer 112, and the transparent protective substrate 114. FIG. 3G further illustrates the light guide 306, the touch panel 308 (or "touch sensor 308"), and the cover lens 310 introduced with reference to FIG. 3B.

The support frame 202 of FIG. 3G may include front face having a first platform 314 that is located at a periphery of the support frame 202 in a similar configuration to the first platform 302 of the support frame 102. The support frame 202 may further include a second platform 316 that is located at a center of the support frame 202. The curved step 208 is disposed in between the first platform 314 and the second platform 316. In the example of FIG. 3G, the curved step 208 and the second platform 316 forms a raised central area, or plateau, in the center of the support frame 202. A rear surface of the flexible backplane substrate 206 is configured to be mounted upon the second platform 316. Upon full assembly, the support frame 202 and the EPD structure 204 may look like the optical assembly 200 in FIG. 2A. It is to be appreciated that layers 204, 306, and 308 may be laminated together and then curved to contour with the curved step 208, or layers 204, 306, and 308 may be laminated onto the rear surface of the curved cover lens 310 and then attached to the support frame 202.

Figure 3H:
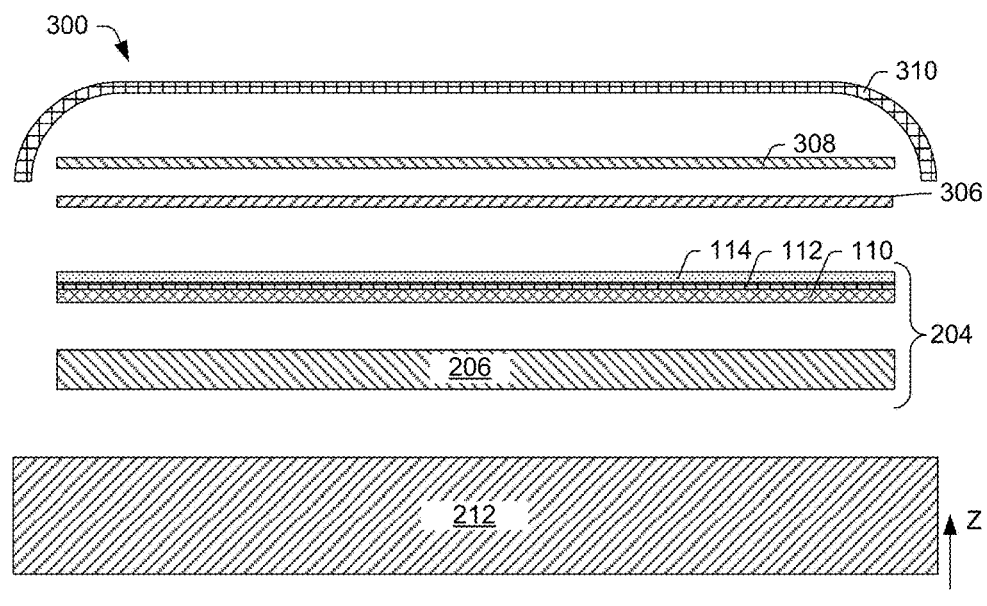
FIG. 3H illustrates a side, cross-sectional, exploded view of the example electronic device of FIG. 3A along section A-A according to another embodiment.

FIG. 3H illustrates a side, cross-sectional, exploded view of the example electronic device 300 of FIG. 3A along section A-A according to another embodiment. Like FIG. 3G, the various layers that make up the display of the electronic device 300 are shown in FIG. 3H in their pre-assembled form. FIG. 3H illustrates many of the same components that were introduced in FIG. 2B, such as the support frame 212 and the EPD structure 204 comprising the flexible backplane substrate 206, the electrophoretic layer 110, the transparent conductive layer 112, and the transparent protective substrate 114. FIG. 3H further illustrates the light guide 306, the touch panel 308 (or "touch sensor 308)), and the cover lens 310 introduced with reference to FIG. 3B.

The support frame 212 shown in FIG. 3H may have a substantially flat front face that omits a curved step, such as the curved step 208 of the support frame 202. This is because the optical assembly in FIG. 3H is to remain substantially flat when assembled. Furthermore, the curved nature of the cover lens 310 may be configured to obscure any given border surrounding the display by optical redirection, similar to the technique described above with reference to FIG. 3D. In this manner, the EPD structure 204 may remain substantially flat when assembled, yet any thin border that remains (e.g., due to the edge seal 122 shown in FIG. 2B) around the EPD structure 204 may be obscured from the perspective of a viewer because light rays are refracted by an offset, p, as shown in FIG. 3D. Of course, the cover lens 310 may be a substantially flat in some embodiments and does not have to be curved.

Figure 3I:
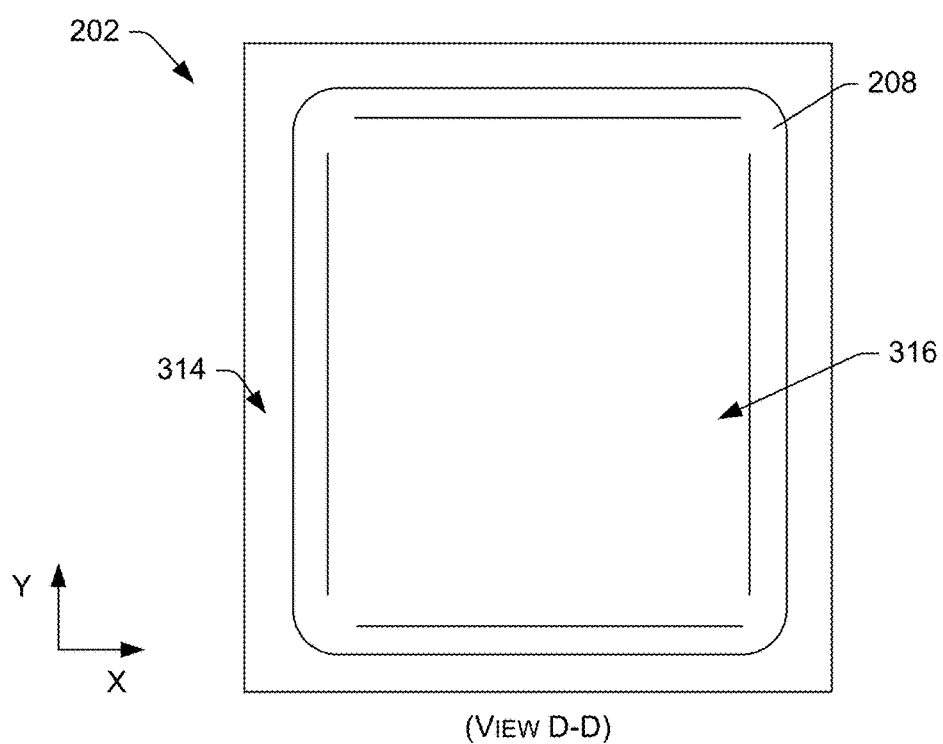
FIG. 3I illustrates a front view of an example support frame shown in FIG. 3G as seen from view D-D.

FIG. 3I illustrates a front view of an example support frame 202 shown in FIG. 3G as seen from view D-D. FIG. 3I shows that the support frame 202 may include a curved step 208 that is positioned in between the first platform 314 and the second platform 316. The curved step 208 may be a continuous feature that surrounds the entire second platform 316, as shown in FIG. 3I, which may allow for a four sided thin border display using the flexible backplane substrate 206. However, it is to be appreciated that, in some implementations, the curved step 208 may extend along a single side of the support frame 202, along two opposing sides of the support frame 202, or along two or three adjacent or contiguous sides of the support frame 202.

FIG. 4 illustrates example configurations for electronic devices having thin border displays. An example electronic device 400 represents a typical electronic device having a display of size, d, measured along the diagonal. Notably, the display of the electronic device 400 has a border around all four sides of the display. Accordingly, example electronic devices 300A, 300B, 300C, 300D, and 300E illustrate various example configurations of a "thin border" display that increases the size, d, of the display, and makes the content rendered on the display appear more like a paper, hardcopy of the content rendered thereon.

Electronic device 300A is an example of an electronic device having a one sided thin border display configuration. The thin border display shown by the example device 300A may be accomplished by having a portion of an EPD structure, such as the EPD structure 104 or the EPD structure 204, curved over a curved step, such as the curved step 116 or the curved step 208, that extends along one side of the support frame 102/202 on which the curved step is formed.

Electronic device 300B is an example of an electronic device having a two sided thin border display configuration at opposing sides of the electronic device 300B. Electronic device 300C is an example of an electronic device having a two sided thin border display configuration at adjacent sides of the electronic device 300C. Thus, the display of the electronic device 300C wraps around a corner of the electronic device 300C. Electronic device 300D is an example of an electronic device having a three sided thin border display configuration. Lastly, electronic device 300E is an example of an electronic device having a four sided thin border display configuration.

Figure 5C:
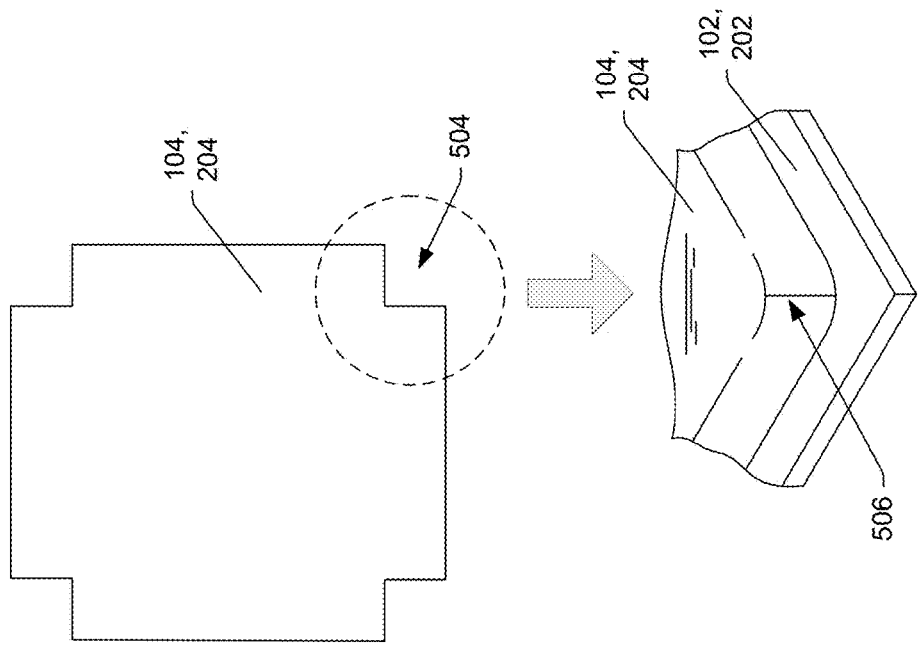
FIGS. 5A-5C illustrate example techniques for wrapping a portion of an electrophoretic display structure around a corner of a curved step of a support frame.
Figure 5A:
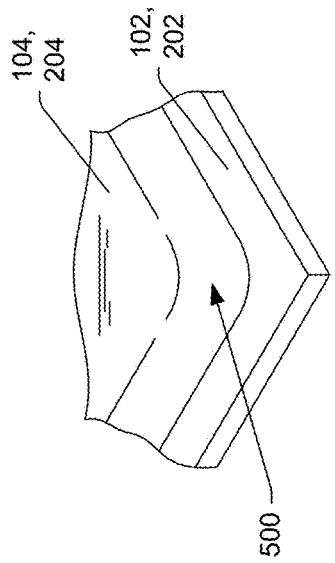
Figure 5B:
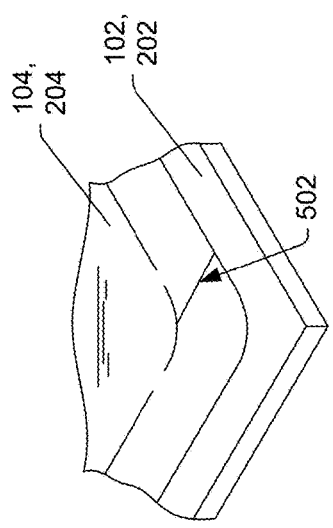

FIGS. 5A-5C illustrate example techniques for wrapping a portion of an EPD structure, such as the EPD structure 104 or the EPD structure 204, around a corner of a curved step of a support frame, such as the support frame 102 or the support frame 202. Particularly, when the thin border display is implemented as a two sided thin border display at adjacent sides of the support frame 102/202, or a three sided thin border display, or a four sided thin border display, the EPD structure 104/204 is curved or wrapped around the curved step 116/208 of the support frame 102/202 at one or more corners of the curved step 116/208.

There are various ways in which the EPD structure 104/204 can be wrapped around a corner of the curved step 116/208 on the support frame 102/202. FIG. 5A illustrates an example technique for wrapping the EPD structure 104/204 to the corner 500 of the support frame that involves heat shrinking the portion of the EPD structure 104/204 at the corner 500. Thus, the EPD structure 104/204 may be made of a heat-shrinkable plastic material that contracts or shrinks to a smaller size upon application of heat, irradiation, ultraviolet radiation), and the like. Such a material may include polystyrene or polypropylene thermoplastic material that is heat-shrinkable to conform to the shape of the corner 500 in a smooth fit.

FIG. 5B illustrates another example technique for wrapping the EPD structure 104/204 to the corner 500 of the support frame that involves folding the EPD structure 104/204 around the corner 500. FIG. 5B shows a fold line 502 where the EPD structure 104/204 has been folded to conform overlap the EPD structure 104/204 from the neighboring side to form the shape of the corner 500.

FIG. 5C illustrates another example technique for wrapping the EPD structure 104/204 to the corner 500 of the support frame that involves cutting away material from one or more corners of the EPD structure 104/204 before attachment to the support frame 102/202. FIG. 5C shows a cut 504 that can be made at the corner of the EPD structure 104/204 that is square-shaped. If all four corners of the EPD structure 104/204 are to be wrapped around a corner 500 of the curved step 116/208 on the support frame 102/202, the resulting shape of the EPD structure 104/204 may be an "iron-cross" shape. FIG. 5C illustrates that, upon attachment at the corner 500 of the curved step 116/208, there may be a slit 506 running down the corner 500 that can be sealed with a sealant, such as a resin material, such as Phenoxy Resin.

Figure 6:
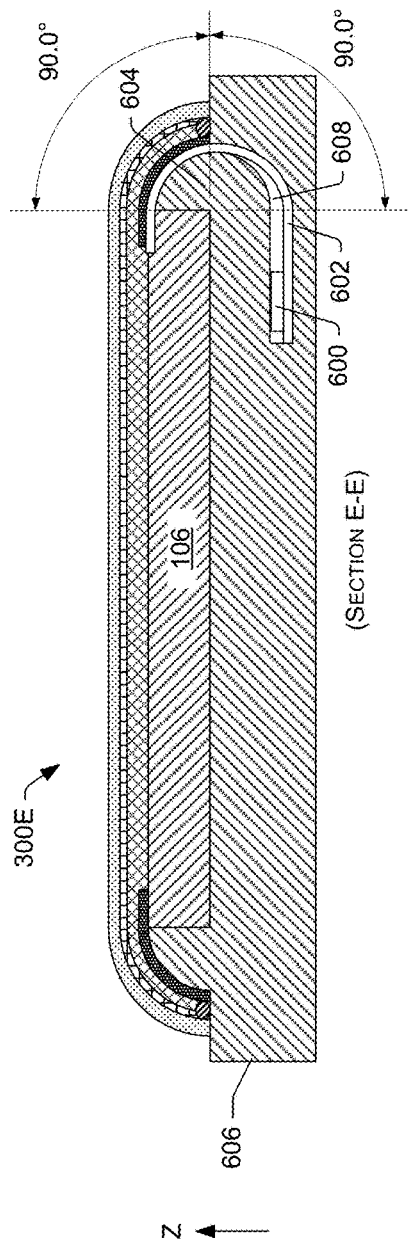
FIG. 6 illustrates a side, cross-sectional view of an example electronic device shown in FIG. 4 along section E-E according to one embodiment.
Figure 7:
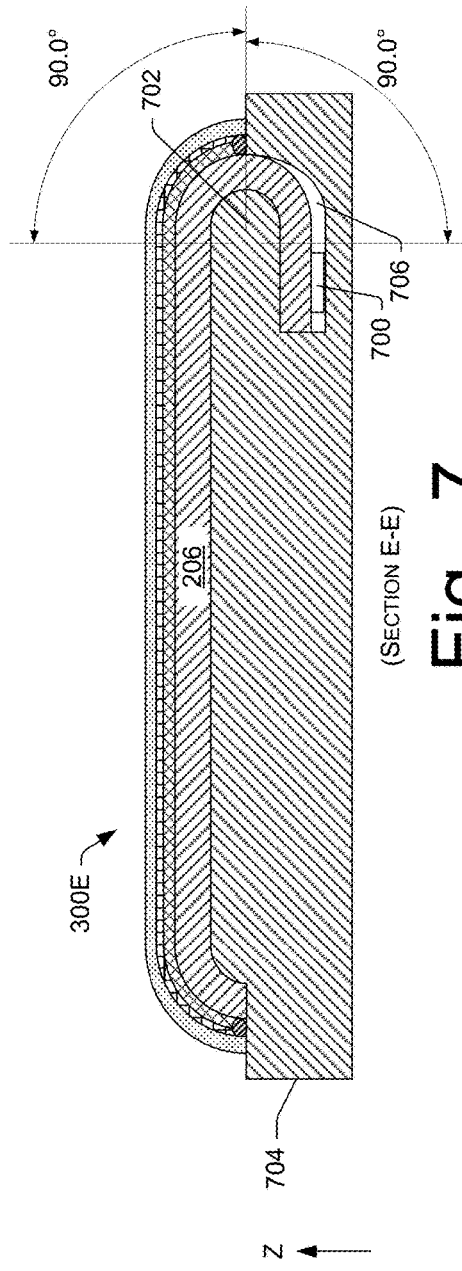
FIG. 7 illustrates a side, cross-sectional view of an example electronic device shown in FIG. 4 along section E-E according to another embodiment.

FIG. 6 illustrates a side, cross-sectional view of an example electronic device 300E shown in FIG. 4 along section E-E according to one embodiment. The electronic device 300E represents a four sided thin border display configuration. In this four sided thin border display configuration, one or more driver chips 600 (or driving integrated circuits (ICs) 600) may be electrically coupled to the rigid backplane substrate 106 via a flex circuit 602. The driver chip(s) 600 are electrically coupled to the pixel electrode of a TFT type of rigid backplane substrate 106 and provide the drive signals to the pixel electrode that generates the electric field for influencing the electrophoretic particles in the display to form an image thereon. When the thin border display is a one, two, or three-sided thin border display, there may be room for the driver chip(s) 600 to reside on substantially the same plane as the rigid backplane substrate 106. However, in the implementation shown in FIG. 6, the flex circuit 602 is attached to the front surface of the backplane substrate and curves around the curved projection 604 in the support platform 606, making a turn of about 180°, and terminating at a point within the support platform 606 where the driver chip(s) 600 is oriented on a horizontal plane behind the rigid backplane substrate 106 at a distance from the rigid backplane substrate 106 in the negative Z-direction. In this configuration, the support platform 606 may include a slot 608 (or conduit) for the flex circuit 602 to extend within, and for placement of the driver chip(s) 600 within the support platform 606 and behind the rigid backplane substrate 106. The driver chip 600 is shown as being mounted on an inside surface of the flex circuit 602 so that the electrical connections run along the inside surface of the flex circuit 602 and make an electrical connection to the front surface of the rigid backplane substrate 106 where the drive circuits, pixel electrode, and interconnect lines are located. FIG. 7 illustrates a side, cross-sectional view of an example electronic device 300E shown in FIG. 4 along section E-E according to another embodiment. In the example of FIG. 7, the backplane substrate 206 is flexible, as described with reference to the configurations shown in FIGS. 2 and 3G. In this configuration, one or more driver chips 700 (or driving ICs 700) may be mounted directly on the flexible backplane substrate 206 and electrically coupled to the pixel electrode and/or drive circuits of the flexible backplane substrate 206. The flexible backplane substrate 206 also curves around a curved projection 702 in the support platform 704, making a turn of about 180°, and terminating at a point within the support platform 704 where the driver chip(s) 700 is oriented on a horizontal plane behind the flexible backplane substrate 206 at a distance from the flexible backplane substrate 206 in the negative Z-direction. In this configuration, the support platform 704 may include a slot 706 (or conduit) for flexible backplane substrate 206 to extend within, and for placement of the driver chip(s) 700 within the support platform 704 and behind the flexible backplane substrate 206.

It is to be appreciated that the specific dimensions, proportions, shapes and configurations of the components described herein are not specific to the present invention. For example, the electronic devices and display components therein may be of various sizes (length and/or width), and shapes (e.g., rectangular, elliptical, square, triangular, etc.) without changing the basic characteristics of the thin border display.

The processes disclosed herein are illustrated as a collection of blocks in a logical flow graph. The order in which the operations are described is not intended to be construed as a limitation, and any number of the described blocks can be combined in any order or in parallel to implement the processes.

Figure 8:
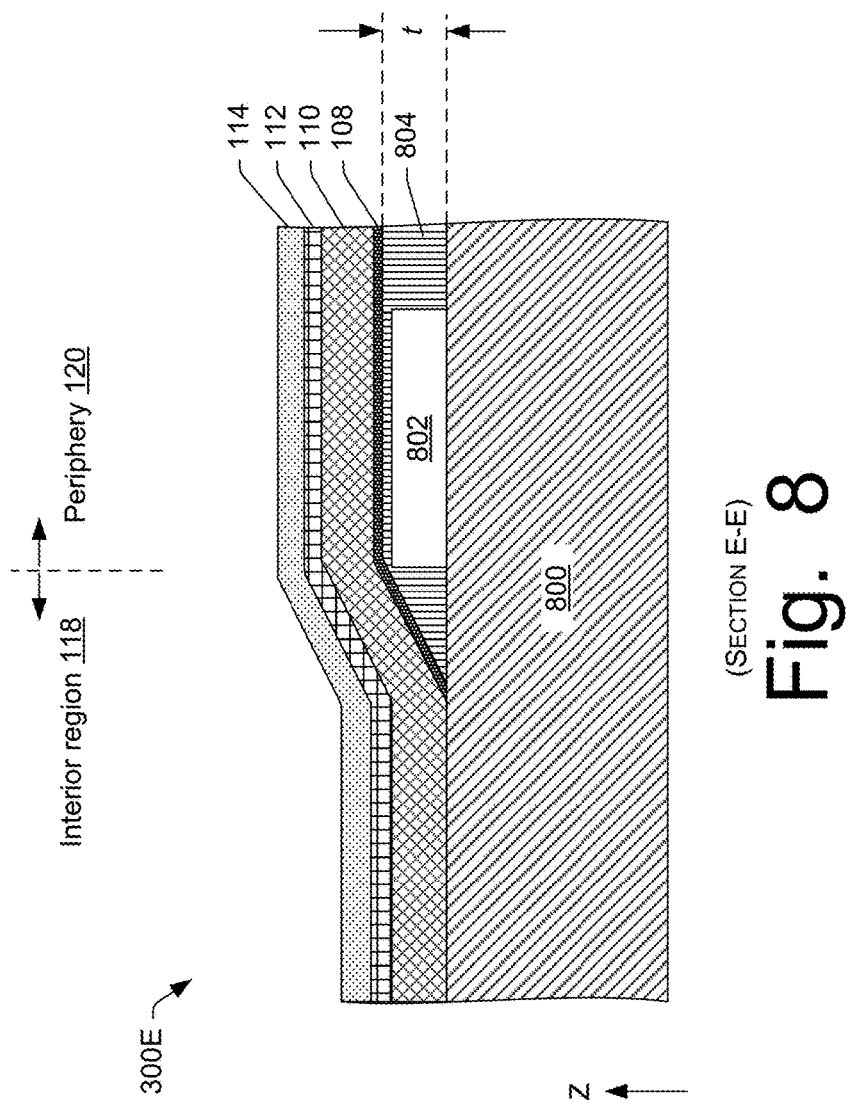
FIG. 8 illustrates a side, cross-sectional view of a portion of the example electronic device shown in FIG. 4 along section E-E illustrating an encapsulation layer or encapsulation shim disposed on an example driver chip.

FIG. 8 illustrates a side, cross-sectional view of a portion of the example electronic device 300E shown in FIG. 4 along section E-E. FIG. 8 illustrates a backplane substrate 800 that can represent either the rigid backplane substrate 106 or the flexible backplane substrate 206 described herein. A driver chip(s) 802 may be disposed atop a front surface of the backplane substrate 800, and may be electrically coupled to the backplane substrate 800 for driving the electrodes and circuitry associated therewith. Typically, the existence of the driver chip 802 on the front surface of the backplane substrate 800 would render the portion of the display where the driver chip 802 resides unusable for displaying information thereon. FIGS. 6 and 7 illustrate example techniques for increasing the usable display area on the electronic device 300E by wrapping the driver chips 600 and 700, respectively, to the rear side of the backplane substrate. In FIG. 8, an alternate technique is shown for increasing the usable display area without moving the driver chip 802 to the rear side of the backplane 800.

FIG. 8 shows an encapsulation layer 804 that is disposed on the driver chip 802. The electrode 108 may be disposed on the encapsulation layer 804 such that the electrode 108 is ultimately disposed between the encapsulation layer 804 and the electrophoretic layer 110. In this manner, the electrode 108 is configured to drive the display (e.g., drive the display to white, black, a shade of grey, or another suitable color) at the portion of the display where the driver chip 802 resides (typically the periphery 120 of the display). In this manner, the driver chip 802 can remain on the front surface of the backplane substrate 800.

FIG. 8 illustrates that the encapsulation layer 804 may have a maximum thickness, t, and that the thickness may taper to a smaller and smaller thickness along a direction toward the interior region 118 of the display until the encapsulation layer 804 terminates on the backplane substrate 800. In this manner, the encapsulation layer 804 may be "wedge-shaped" to cover the driver chip 802 but to not extend beyond an area proximate to the driver chip 802. The maximum thickness, t, of the encapsulation layer 804 may be no greater than about 250 microns, no greater than about 220 microns, no greater than about 210 microns, no greater than about 200 microns, no greater than about 190 microns, or no greater than about 180 microns. The maximum thickness, t, may depend on the thickness of the driver chip 802, which may be on the order of about 200 microns. In some embodiments, a planarization layer may be disposed on the transparent protective substrate 114 to planarize the optical assembly due to the tapered thickness of the encapsulation layer 804.

In some embodiments, the encapsulation layer 804 comprises an insulating material that is deposited atop the driver chip 802 during a manufacturing process. Any suitable insulating material may be used for the encapsulation layer 804, including, without limitation, silicon dioxide, silicon nitride, or any other insulating material that ensures that electrical components are not shorted during operation of the electronic device 300E. Any suitable technique for depositing the encapsulation layer 804 may be utilized, including techniques such as a sputtering, chemical vapor deposition (CVD), physical vapor deposition (PVD), and the like. In some embodiments, the encapsulation layer 804 may be smoothed or planarized on its front/top surface after it has been deposited on the driver chip 802.

In some embodiments, the encapsulation layer 804 may come pre-formed or pre-manufactured so that it can be placed on top of the driver chip 802 during a manufacturing/assembly process. In this embodiment, the encapsulation layer 804 may comprise a pre-formed shim or similar component. The pre-formed shim may include a recessed volume on a rear side of the shim to accommodate the volume of the driver chip 802 therein and to minimize the overall thickness of the device 300E. The pre-formed shim may be attached to the backplane substrate 800 using any suitable means for attaching, such as adhesive, fasteners (e.g., pins, clamps, etc.), and so on.

Figure 9:
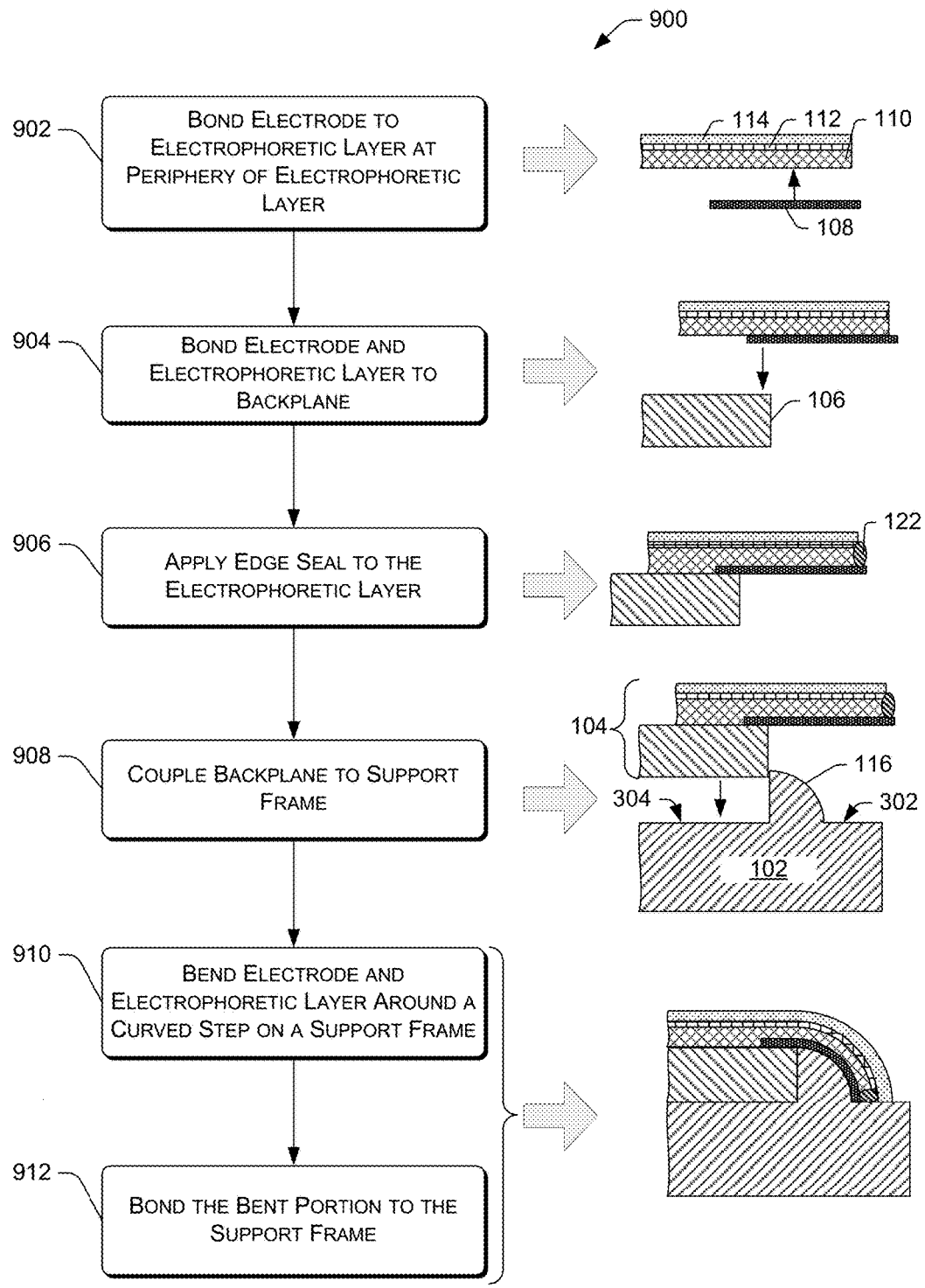
FIG. 9 is a flow diagram of an illustrative process for manufacturing an optical assembly for a display of an electronic device according to one embodiment.

FIG. 9 is a flow diagram of an illustrative process 900 for manufacturing an optical assembly for a display of an electronic device according to one embodiment. The process 900 may be implemented to manufacture, fabricate, assemble, and/or produce any of the embodiments of the optical assemblies illustrated in FIGS. 1A, 1B, 3B, 3C, 3D, 6, and 8.

At 902, an electrode 108 may be bonded to an electrophoretic layer 110 at a periphery of the electrophoretic layer 110. The electrophoretic layer 110 may be provided from a drum that was made in a separate manufacturing process. For example, a roll-to-roll process for making electrophoretic display material may include depositing a transparent conductive layer 112 (e.g., ITO layer) onto a transparent protective substrate 114, and depositing electrophoretic material onto the transparent conductive layer 112 to form the electrophoretic layer 110. An adhesive may be applied to the surface of the electrophoretic layer 110, and a protection film (typically a plastic film called a "relief layer") may be applied on top of the adhesive and electrophoretic layer 110. This structure may then be rolled up into a drum so that individual pieces of EPD material may be pulled out and cut off for manufacturing an EPD.

Accordingly, the bonding at 902 may include cutting a piece of EPD from a drum, peeling back the protection film to expose the adhesive on the electrophoretic layer 110, and laminating the electrode 108 to the electrophoretic layer 110 by applying pressure to the rear surface of the electrode 108 to create a firm bond between the electrode 108 and the electrophoretic layer 110. As noted above, the electrode 108 may be shaped like a rectangular frame (shown in FIG. 3E) to cover the periphery (or margin) of the electrophoretic layer 110 after it is bonded to the electrophoretic layer 110.

At 904, the electrode 108 and the electrophoretic layer 110 may be bonded to a front surface of a rigid backplane substrate 106, which may comprise a rigid, glass TFT array substrate. The bonding at 904 may include applying adhesive to a rear surface of the electrode 108 and bonding the electrode to the front surface of the rigid backplane substrate 106 at a periphery of the rigid backplane substrate 106, and bonding the electrophoretic layer 110 to the front surface of the rigid backplane substrate 106 where the electrode 108 does not cover the rigid backplane substrate 106 by applying pressure on the transparent protective substrate 114 when the layers are aligned for bonding. The adhesive that may be applied to the rear surface of the electrode 108 may be a conductive adhesive in order to provide an electrical coupling between the rigid backplane substrate 106 and the electrode 108 at the interface between them. The EPD material may be flexible enough to bond the electrophoretic layer 110 to the rigid backplane substrate 106 notwithstanding the existence of the electrode 108 in between the rigid backplane substrate 106 and the electrophoretic layer 110 at the periphery of the electrophoretic layer 110. However, a planarization layer may be applied to the rigid backplane substrate 106 on the front surface where the electrode 108 does not cover the rigid backplane substrate 106 to planarize the electrophoretic layer 110 in the interior region 118 of the electrophoretic layer 110.

In some embodiments, the electrode 108 may overlap a periphery of the rigid backplane substrate 106 where address lines or non-useful pixels (e.g., the outermost pixel in every line) are disposed on the rigid backplane substrate 106. Moreover, at least a portion of the electrode 108 and a periphery of the electrophoretic layer 110 extends beyond the outer edge of the rigid backplane substrate 106 after the electrode 108 and the electrophoretic layer 110 are bonded to the rigid backplane substrate 106.

At 906, an edge seal 122 may be deposited between the electrode 108 and the transparent protective substrate 114 where electrophoretic material in the electrophoretic layer 110 is exposed. The edge seal 122 may be a resign material that is applied in a viscous form and that hardens after application, such as by using a Phenoxy Resin. The edge seal 122 may be applied to a width within a range of about 2.5 mm to 3 mm. The edge seal 122 may prevent the ingress of environmental contaminants, such as oxygen and water vapor, to the electrophoretic material in the electrophoretic layer 110.

At 908, the rigid backplane substrate 106, at its rear surface, may be coupled to a support frame 102 at the second platform 304 of the support frame 102. The rigid backplane substrate 106 may be bonded to the second platform 304, such as with adhesive, or it may be press fit within the support frame 102. In some embodiments, the support frame includes a curved step 116, such as with the support frame 102 of FIG. 1A. In other embodiments, the support frame omits the curved step 116, such as with the support frame 126 of FIG. 1B.

At 910, the portion of the EPD structure 104 that comprises the electrode 108 and the periphery of the electrophoretic layer 110 may be bent or flexed over a curved step 116 of the support frame 102. The extent to which the electrode 108 and the electrophoretic layer 110 overhang (i.e., extend beyond) the outer edge of the rigid backplane substrate 106 dictates the extent of the turn made at the curved portion of the EPD structure 104. For example, with less overhang, the curved portion of the EPD structure 104 may make a turn that is less than 90°, and with more overhang, the curved portion of the EPD structure 104 may make a turn that is 90° or greater (e.g., a turn of 180°). The EPD structure 104 may be cut to fit or accomplish any degree of turn. The radius, R, of curvature of the curved portion of the EPD structure 104 may be about 3 mm. Moreover, with a thin border display configuration having at least two adjacent thin border sides, the bending at 910 may include wrapping a portion of the EPD structure 104 around a corner of the curved step 116. This may be accomplished using any suitable technique, such as any of the techniques illustrated in FIGS. 5A-5C. With a four sided thin border display configuration, the bending at 910 may further include bending a flex circuit 602 around a curved projection 604 to position one or more drive chips 600 behind the rigid backplane substrate 106 and within the support frame 606, as shown in FIG. 6. In some embodiments, the flex circuit 602 with the driver chip(s) 600 may be wrapped around the support frame 606 by making a turn of about 180° while the curved portion of the EPD structure 104 makes a turn that is about 90°, as shown in FIG. 6. Alternatively, an encapsulation layer 804 may be disposed on a driver chip(s) 802 that is disposed on the front surface of the rigid backplane substrate 106, and the electrode 108 may be disposed over the encapsulation layer 804 to drive the display over the driver chip(s) 802, as is shown in FIG. 8. In this manner, the driver chip(s) 802 is not moved from the front surface of the rigid backplane substrate 106.

It is to be appreciated that the transparent conductive layer 112, which may be comprised of a layer of ITO, may be susceptible to failure (e.g., cracking) when the EPD structure 104 is bent at 910. Thus, careful selection of the elastic modulus of the material used for the transparent protective substrate 114 may control the location of the highest stress region so that the neutral stress point is near the electrophoretic layer 110 (i.e., the neutral stress point is located at the top, middle, or bottom of the electrophoretic layer 110). This may mitigate the susceptibility of the transparent conductive layer 112 to failure upon bending at 910.

At 912, the bent or curved portion of the EPD structure 104 may be bonded to the support frame 104. The attachment points may be on the surface of the curved step 116 and/or on the surface of the first platform 302. Depending on the number of sides that are to have "thin borders", steps 910 and 912 may be repeated for each side where the EPD structure 104 is to be curved around the support frame 102. In some embodiments, step 910 may be omitted and the overhanging portion of the electrode 108 may be bonded to a substantially flat portion of the support frame at step 912, such as the support frame 126 of FIG. 1B.

In some embodiments, the application of the edge seal 122 to the electrophoretic layer 110 may be performed subsequent to bending the EPD structure 104 at step 910. For example, the electrode 108 and the electrophoretic layer 110 may be bent and laminated to a curved (molded) cover lens 310, and then the edge seal 122 may be applied to the electrophoretic layer 110 at its edge. Alternatively, the edge seal 122 may be applied as part of the bonding step at 912 where the edge seal 122 can be applied when the bent portion of the EPD structure 104 is bonded to the curved step 116, thus placing less stress on the edge seal during bonding.

Furthermore, the process 900 may include providing a light guide 306 on the transparent protective substrate 114, providing a touch panel 308 on the light guide 306, and providing a cover lens 310 over the touch panel. In some embodiments, conductive traces on the touch panel 308 may be removed or altered on the corners where the touch panel 308 is curved so that touch accuracy is improved and noise is reduced. The light guide 306 and the touch panel 308 may be flexible so as to be curved around the support frame 102, and the cover lens 310 may be pre-molded in a curved configuration. Lamination between the layers 306-310 may be performed using an optically clear adhesive (OCA), and/or liquid OCA (LOCA), to create a firm optical bond between the layers.

Figure 10:
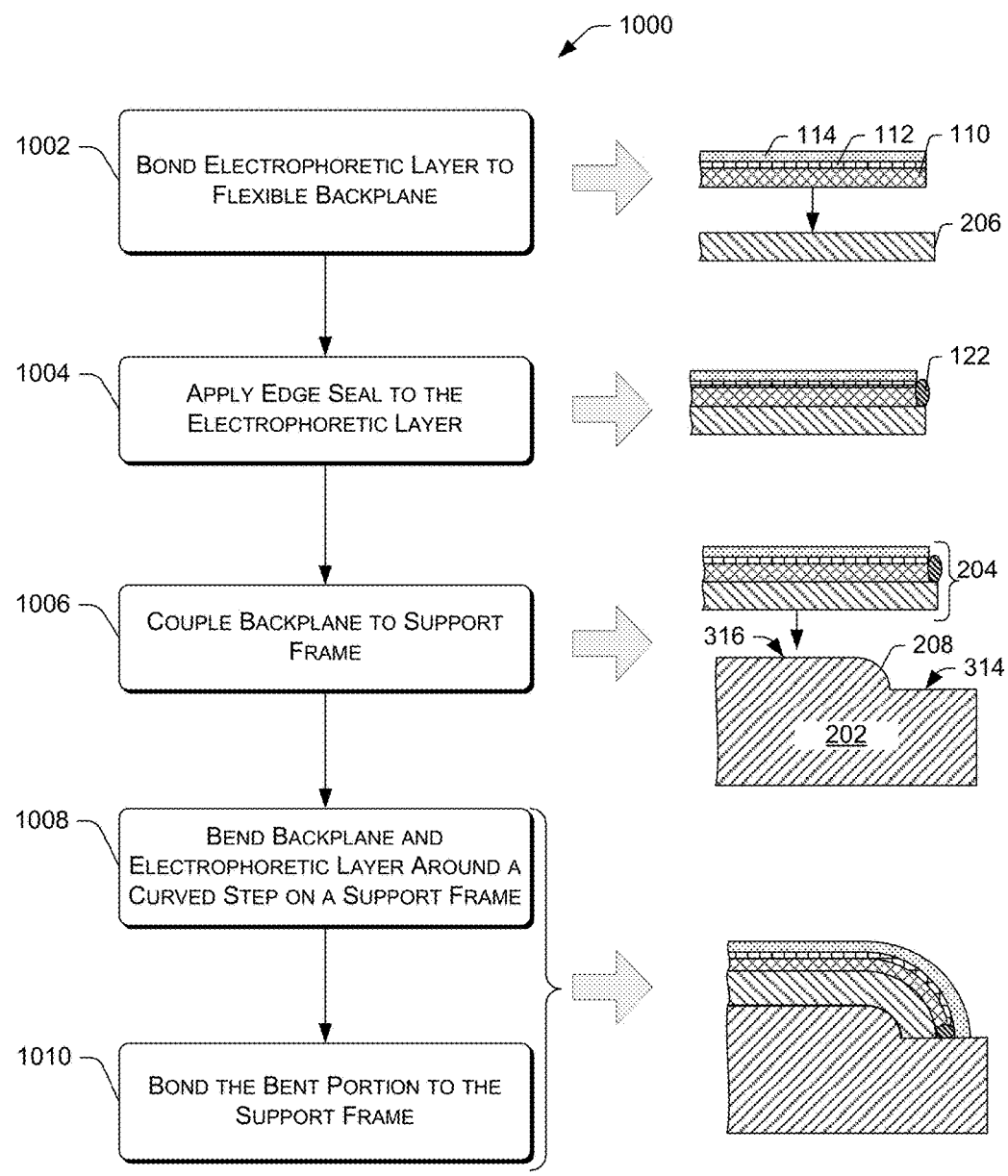
FIG. 10 is a flow diagram of an illustrative process of manufacturing an optical assembly for a display of an electronic device according to another embodiment.

FIG. 10 is a flow diagram of an illustrative process 1000 of manufacturing an optical assembly for a display of an electronic device according to another embodiment. The process 1000 may be implemented to manufacture, fabricate, assemble, and/or produce any of the embodiments of the optical assemblies illustrated in FIGS. 2A, 2B, 3G, 3H, 7, and 8.

At 1002, an electrophoretic layer 110 may be bonded to a front surface of a flexible backplane substrate 206, which may be made of polyamide (PA) or any other suitable flexible substrate material. The electrophoretic layer 110 may be provided at 1002 by cutting a piece of EPD material (e.g., a transparent conductive layer 112 and an electrophoretic layer 110 deposited on a transparent protective substrate 114) from a drum, peeling back a protection film to expose adhesive on the electrophoretic layer 110, and laminating the electrophoretic layer 110 to the front surface of the flexible backplane substrate 206 by applying pressure on the transparent protective substrate 114.

At 1004, an edge seal 122 may be deposited between the flexible backplane substrate 206 and the transparent protective substrate 114 where electrophoretic material in the electrophoretic layer 110 is exposed.

At 1006, the flexible backplane substrate 206, at its rear surface, may be coupled to a support frame 202 at the second platform 316 of the support frame 202. The flexible backplane substrate 206 may be bonded to the second platform 316, such as with adhesive. In some embodiments, the support frame includes a curved step 208, such as with the support frame 202 of FIG. 2A. In other embodiments, the support frame omits the curved step 208, such as with the support frame 212 of FIG. 2B.

At 1008, the portion of the EPD structure 204 that comprises the flexible backplane substrate 206 and the electrophoretic layer 110, at their respective peripheries, may be bent or flexed over a curved step 208 of the support frame 202. The extent to which the flexible backplane substrate 206 and the electrophoretic layer 110 curve around the support frame 202 may vary. For example, the curved portion of the EPD structure 204 may make a turn that is less than 90°, equal to 90°, or greater than 90° (e.g., a turn of 180°). EPD structure 204 may be cut to fit or accomplish any degree of turn. The radius, R, of curvature of the curved portion of the EPD structure 204 may be about 3 mm.

Moreover, with a thin border display configuration having at least two adjacent thin border sides, the bending at 1008 may include wrapping a portion of the EPD structure 204 around a corner of the curved step 208. This may be accomplished using any suitable technique, such as any of the techniques illustrated in FIGS. 5A-5C. With a four sided thin border display configuration, the bending at 1008 may further include bending a side of the flexible backplane substrate 206 having the driver chip(s) 700 around a curved projection 702 to position the drive chip(s) 700 behind the flexible backplane substrate 206 and within the support frame 704, as shown in FIG. 7. In some embodiments, the side of the flexible backplane substrate 206 with the driver chip(s) 700 may be wrapped around the support frame 704 by making a turn of about 180° while the curved portion of the EPD structure 204 makes a turn that is about 90°, as shown in FIG. 7. Alternatively, an encapsulation layer 804 may be disposed on a driver chip(s) 802 that is disposed on the front surface of the flexible backplane substrate 206, and an electrode, such as the electrode 108, may be disposed over the encapsulation layer 804 to drive the display over the driver chip(s) 802, as is shown in FIG. 8. In this manner, the driver chip(s) 802 is not wrapped around to the backside of the display.

It is to be appreciated that the transparent conductive layer 112, which may be comprised of a layer of ITO, and the electrodes and conductive traces on the front surface of the flexible backplane substrate 206, may be susceptible to failure (e.g., cracking) when the EPD structure 204 is bent at 1008. Thus, careful selection of the elastic modulus of the materials used for both the transparent protective substrate 114 and the flexible backplane substrate 206 may control the location of the highest stress region so that the neutral stress point is near the electrophoretic layer 110 (i.e., the neutral stress point is located at the top, middle, or bottom of the electrophoretic layer 110). This may mitigate the susceptibility of the transparent conductive layer 112 and the electrodes and conductive traces on the flexible backplane substrate 206 to failure upon bending at 1008.

At 1010, the bent or curved portion of the EPD structure 204 may be bonded to the support frame 204. The attachment points may be on the surface of the curved step 208 and/or on the surface of the first platform 314. Depending on the number of sides that are to have "thin borders", steps 1008 and 1010 may be repeated for each side where the EPD structure 204 is to be curved around the support frame 202. In some embodiments, steps 1008 and 1010 may be omitted from the process 1000, such as when the EPD structure 204 remains substantially flat and is bonded to a substantially flat portion of the support frame, such as the support frame 212 of FIG. 2B.

In some embodiments, the application of the edge seal 122 to the electrophoretic layer 110 may be performed subsequent to bending the EPD structure 204 at step 1008. For example, the flexible backplane 206 and the electrophoretic layer 110 may be bent and laminated to a curved (molded) cover lens 310, and then the edge seal 122 may be applied to the electrophoretic layer 110 at its edge. Alternatively, the edge seal 122 may be applied as part of the bonding step at 1010 where the edge seal 122 can be applied when the bent portion of the EPD structure 204 is bonded to the curved step 208, thus placing less stress on the edge seal during bonding.

In some embodiments, the process 1000 may include providing a light guide 306 on the transparent protective substrate 114, providing a touch panel 308 on the light guide 306, and providing a cover lens 310 over the touch panel. In some embodiments, conductive traces on the touch panel 308 may be removed or altered on the corners where the touch panel 308 is curved so that touch accuracy is improved and noise is reduced. The light guide 306 and the touch panel 308 may be flexible so as to be curved around the support frame 202, and the cover lens 310 may be pre-molded in a curved configuration. Lamination between the layers 306-310 may be performed using an optically clear adhesive (OCA), and/or liquid OCA (LOCA), to create a firm optical bond between the layers.

Figure 11:
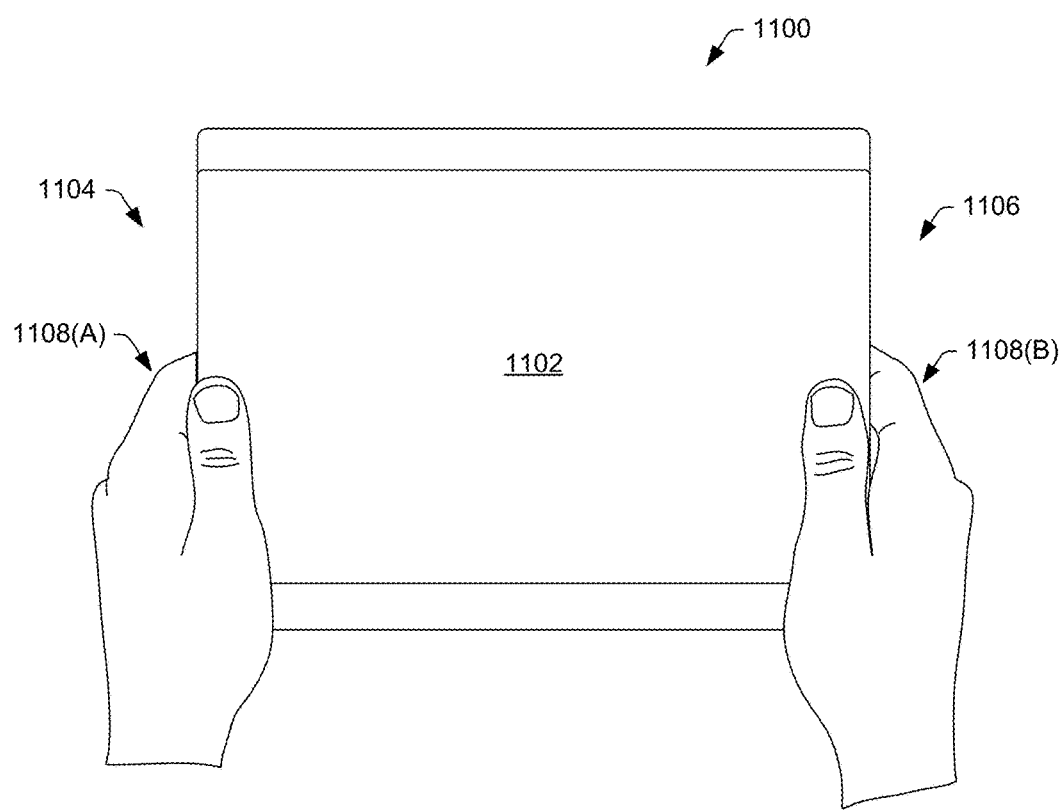
FIG. 11 illustrates an example technique for allowing a user to hold an electronic device having a thin border display.

FIG. 11 illustrates an example technique for allowing a user to hold an electronic device 1100 having a thin border display 1102. In the example of FIG. 11, the thin border display 1102 is a two sided thin border display where the EPD structure 104/204 curves around two opposing sides of the support frame 102/202 to make a first side 1104 of the display 1102 and the second side 1106 of the display appear borderless. Here, the user's hands 1108(A) and 1108(B) are grasping and holding the electronic device 1100 at the first side 1104 and the second side 1106, respectively, which may be a natural way for the user to hold a tablet or e-book reader when viewing content rendered on the display 1102. In some embodiments, portions of the display 1102 may be configured to deactivate the touch panel 308 at those portions so as to be unresponsive to touch input on the screen. For example, the edge portions of the display 1102 at the first side 1104 and the second side 1106 may be deactivated so that the user can grasp the electronic device 1102 at the sides without causing an operation to occur in response to touching the display 1102 at those locations.

Alternatively, the electronic device 1100 may be configured to disable or deactivate the touch panel 308 in response to the user's finger or hands 1108(A) and 1108(B) touching the display 1102 and sustaining the touch for more than a threshold amount of time (e.g., 0.5 seconds). In this manner, the user may be able to provide touch-based input, so long as the touch event is not sustained for longer than the threshold amount of time, but is able to hold the device on portions of the display 1102 without causing touch-based input to be registered by the electronic device 1100.

Figure 12A:
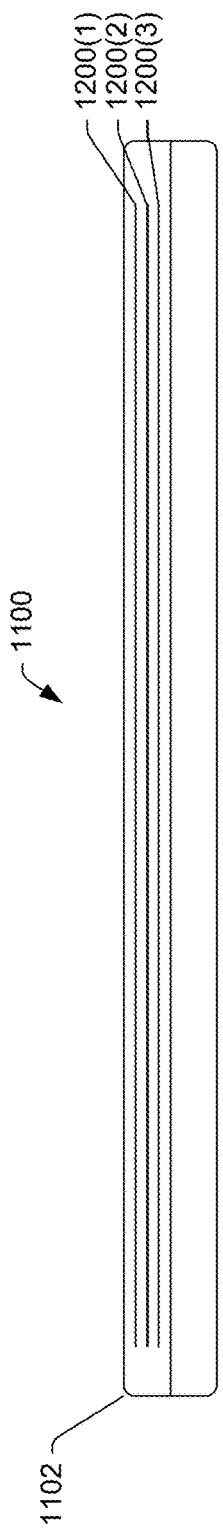
FIG. 12A illustrates a side elevation view of an example electronic device showing example indicia that can be displayed on a side portion of the thin border display.

FIG. 12A illustrates a side elevation view of an example electronic device 1100 showing example indicia 1200(1)-(3) that can be displayed on a side portion of the thin border display 1102. In this example, the indicia 1200(1)-(3) are lines running the length of the electronic device 1100 that look similar to a non-binding side of a tangible, hardcopy book, and that indicate to a user a number of pages remaining in an e-book that the user is reading on the electronic device 1100. Although three lines 1200(1)-(3) are shown, it is to be appreciated that any number of lines may be used to represent a remaining number of pages to be read in the e-book. In the implementation of the thin border display where the electrode 108 is used to drive the periphery 120 of the display 1102, the electrode 108 may be patterned into a number of lines that represent 100% of the remaining pages in the book. As the user progresses through the e-book, the number of lines on the patterned electrode 108 may be selectively displayed in order to represent the remaining number of pages to read. The electrode 108 may be patterned so that individual segments of the electrode 108 correspond to respective ones of the lines to be displayed, and each section may be electrically coupled to the rigid backplane substrate 106 so that they are individually addressable by driving corresponding pixels on the rigid backplane substrate 106. It is to be appreciated that a limited number of lines can be displayed on the side portion of the display 1102 shown in FIG. 12A, and that the number of lines displayed may be fewer than the actual number of pages remaining in the e-book. As such, the number of lines displayed at any given time may indicate a percentage of the e-book that remains unread by the user.

In the implementation where the flexible backplane substrate 206 is utilized for the thin border display, the lines may be displayed at the pixel level by addressing those pixels with the backplane (e.g., a TFT array substrate) in the periphery 120 of the display 1102.

Figure 12B:
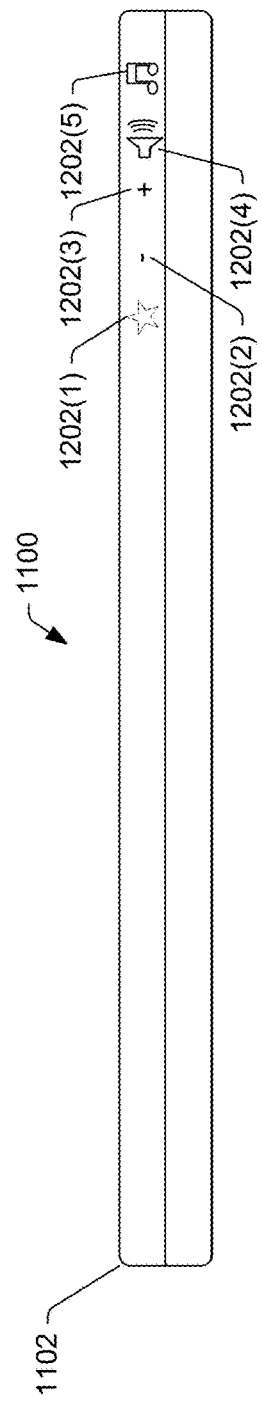
FIG. 12B illustrates a side elevation view of an example electronic device showing other example indicia that can be displayed on a side portion of the thin border display.

FIG. 12B illustrates a side elevation view of an example electronic device 1100 showing other example indicia 1202 that can be displayed on a side portion of the thin border display. For example, a favorites icon 1202(1), a volume down icon 1202(2), a volume up icon 1202(3), a mute icon 1202(4), and/or a music icon 1202(5) may be displayed by patterning the electrode 108, or by addressing pixels on the display 1102 using the flexible backplane substrate 206, depending on the configuration of the thin border display. These are merely examples of possible indicia 1202 that can be displayed. For example, the title of an e-book can be displayed in the periphery 120 of the display 1102, similar to how the binding edge of a tangible, hardcopy book would look.

Figure 13:
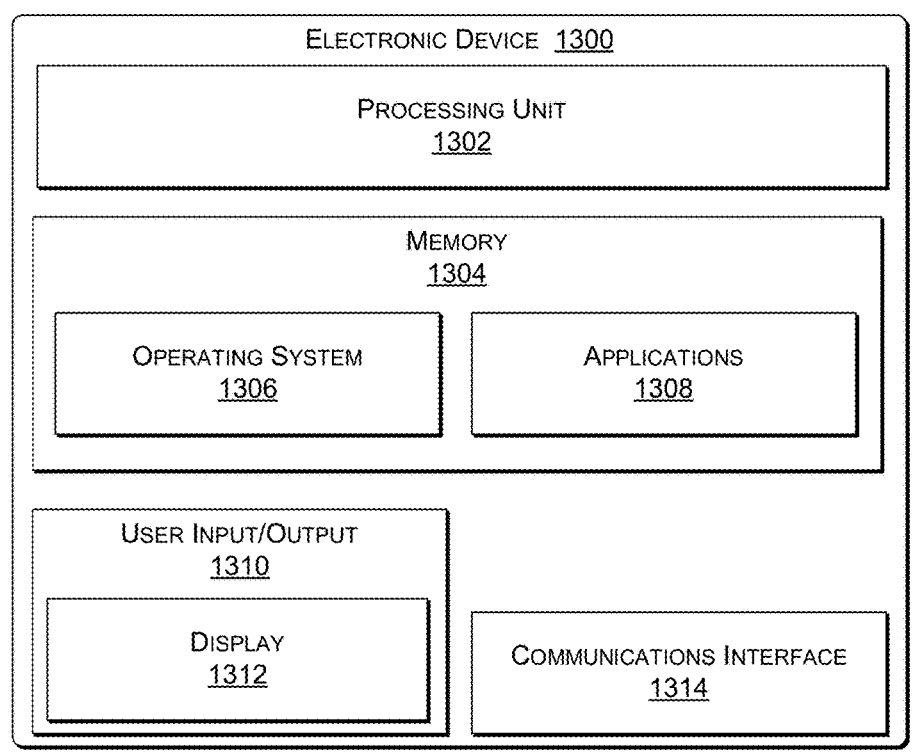
FIG. 13 is a block diagram showing high-level components of an example electronic device that may be used in conjunction with the systems and techniques described herein.

FIG. 13 shows relevant components of an example electronic device 1300 that may be used to implement the systems and techniques disclosed herein. The electronic device 1300 may of course be implemented in many different ways. The electronic device 1300 may comprise any of the above-enumerated devices introduced above.

The example electronic device 1300 may comprise one or more processing units 1302 and one or more forms of computer-readable memory 1304. The memory 1304 may comprise volatile and nonvolatile memory. Thus, the memory 1304 may include, but is not limited to, random access memory (RAM), read-only memory (ROM), electrically erasable programmable ROM (EEPROM), flash memory, or other memory technology, or any other medium which can be used to store applications and data. The memory 1304 may also include removable media such as optical disks, portable devices/drives, and so forth.

The memory 1304 may be used to store any number of functional components, such as programs and program modules that are executable on the processing unit 1302. For example, the memory 1304 may store an operating system 1306 and various applications or user-specified programs 1308. The operating system 1306 and/or the user-specified programs 1308 may include components, modules, and/or logic for performing the actions described herein. More specifically, executable components stored in the memory 1304 may comprise computer-executable instructions that, when executed, cause the one or more processing units 1302 to perform acts and to implement techniques described herein.

The electronic device 1300 may also have user input/output components 1310, such as a 1312 display (e.g., a touch-screen display), keyboard, mouse, etc. The display 1312 may represent the thin border display described herein according to various embodiments. The electronic device 1300 may also comprise a communications interface 1314 such as a network interface.

Generally, the functionality described herein may be implemented by one or more electronic devices such as shown by FIG. 13 or by similar devices, with the various actions described above (e.g., displaying indicia 1200, 1202) distributed in various ways across the different electronic devices.

FIG. 14A illustrates a front view of an example an electrophoretic display structure 204 showing various reference regions and components as seen from the front view. FIG. 14B illustrates a side, cross-sectional view of the example electrophoretic display structure 204 of FIG. 14A along section F-F according to one embodiment. FIG. 14B shows that the EPD structure 204 may comprise multiple layers, such as the flexible backplane substrate 206, the electrophoretic layer 110, the transparent conductive layer 112, and the transparent protective substrate 114. In the example of FIGS. 14A and 14B, the backplane substrate 206 is made of a flexible material, as described herein with reference to the configurations shown in FIGS. 2, 3G, and 7, and in contrast to the rigid backplane substrate 106 of FIG. 1A. In this manner, the backplane substrate 206 shown in FIGS. 14A and 14B, being flexible, may be curved over, or around, a support frame, as will be described in more detail below with reference to FIG. 15, along with the other layers 110-114 of the EPD structure 204, which are also flexible.

The portion of the flexible backplane substrate 206 that is to be curved over the curved portion of the support frame is the portion of the flexible backplane substrate 206 that is within a bend region 1400. This portion is sometimes referred to herein as the "second portion" of the flexible backplane substrate 206 because a first portion of the flexible backplane substrate 206 is within a flat inner region 1402, the second portion of the flexible backplane substrate 206 is within the bend region 1400, and a third portion of the flexible backplane substrate 206 is within a flat outer region 1404. The bend region 1400 of the flexible backplane substrate 206 extends between the flat inner region 1402 and the flat outer region 1404 of the flexible backplane substrate 206. In contrast to the second portion of the flexible backplane substrate 206 at the bend region 1400, the first portion of the flexible backplane substrate 206 within the flat inner region 1402 and the third portion of the flexible backplane substrate 206 within the flat outer region 1404 are to remain substantially flat after the EPD structure 204 is attached to the support frame by curving the second portion of the flexible backplane substrate 206 that is within the bend region 1400 around the support frame. The third portion of the flexible backplane substrate 206 within the flat outer region 1404 (shown in FIG. 14B) extends from an outer edge 1406 of the bend region 1400 to an outer edge 1408 of the flexible backplane substrate 206.

The EPD structure 204 may further comprise one or more driver chips 700 mounted on the front surface of the flexible backplane substrate 206 at the third portion of the flexible backplane substrate 206 that is within the flat outer region 1404. As described herein with reference to FIG. 7, the driver chip(s) 700 may be electrically coupled (directly and without a flex circuit) to the pixel electrode and/or drive circuits of the flexible backplane substrate 206. The driver chip(s) 700 may be configured to provide drive signals to the pixel electrode that generates the electric field for influencing the electrophoretic particles in the display to form an image thereon.

FIG. 14A further shows a fan-out region 1410 extending from the driver chip(s) 700 to an active region 1412 (or at least to the edge seal 122 at the periphery of the active region 1412) of the display where images can be displayed to a viewing user. The fan-out region 1410 includes the interconnects between the output of the driver chip(s) 700 and the inputs to the active region 1412 of the display where a single output can be electrically coupled to multiple inputs. The number of inputs to which a single output can be connected within the fan-out region 1410 may vary depending on the load-driving capability of the driver chip(s) 700. It is to be appreciated that the bend region 1400 can overlap with a portion of the active region 1412 of the display, but the bend region 1400 can be spaced a distance (e.g., 5 mm) from the start of the fan-out region 1410.

The fan-out region 1410, as well as the interface (attachment points) where the driver chip(s) 700 is mounted to the flexible backplane substrate 206, can be quite sensitive to mechanical stress. For example, if these areas are left without proper reinforcement layers, the fan-out region 1410 and/or the interface between the driver chip(s) 700 and the flexible backplane substrate 206 may be prone to failure (e.g., breakage) upon flexing the flexible backplane substrate 206 within the bend region 1400 (e.g., during manufacturing when the EPD structure 204 is wrapped around the support frame and attached thereto). This is due to the bend region 1400 being adjacent to the flat outer region 1404 where the driver chip(s) 700 and the fan-out region 1410 are positioned.

Accordingly, the EPD structure 204 can further include an additional protective substrate 1414 that is disposed on the back (or rear) surface of the flexible backplane substrate 206 at the third portion of the flexible backplane substrate 206 that is within the flat outer region 1404. In some configurations, the protective substrate 1414 can span the entire flat outer region 1404 (i.e., the entire third portion of the flexible backplane substrate 206). In this configuration, the protective substrate 1414 can span from the outer edge 1408 of the flexible backplane substrate 206 and past the fan-out region 1410 to a point that can be a distance (e.g., 5 mm) into the active region 1412 of the display. In other configurations, the protective substrate 1414 can span part of the flat outer region 1404, such as a distance (in a direction perpendicular to the z-direction) that covers the length/width of the driver chip(s) 700, or a distance (in a direction perpendicular to the z-direction) that spans the fan-out region 1410.

The protective substrate 1414 may be made of a polymer material (e.g., a hot melt polymer composition, such as a cellulose material) that is, due to its rigid (or semi-rigid) structure after curing, configured to protect the sensitive areas where the driver chip(s) 700 interfaces with the flexible backplane substrate 206 and the fan-out region 1410. Due to the protective substrate 1414, these sensitive areas do not fail (e.g., break) during manufacturing when the second portion of the flexible backplane substrate 206 is flexed in the bend region 1400. The distance (in a direction perpendicular to the z-direction) that the protective substrate 1414 spans can be chosen with a consideration of a trade-off between protecting these sensitive areas and saving space within the electronic device. Furthermore, the protective substrate 1414 can be opaque, transparent, or partially transparent.

The protective substrate 1414 can be considered a "first" protective substrate 1414 having a first thickness, T, as shown in FIG. 14B. The first thickness, T, may be greater than a second thickness of the transparent protective substrate 114 that is disposed on the transparent conductive layer 112 within the bend region 1400 (and within the flat inner region 1402). In some configurations, the first thickness, T, may be at least about 100 microns, at least about 125 microns, at least about 150 microns, at least about 175 microns, at least about 200 microns, at least about 225 microns, or at least about 250 microns. Meanwhile, the transparent protective substrate 114 may have a second thickness that is no greater than about 90 microns, no greater than about 80 microns, no greater than about 70 microns, no greater than about 60 microns, or no greater than about 50 microns. Thus, the EPD structure 204 within the flat outer region 1404 can be made relatively thicker due to the added protective substrate 1414 in the flat outer region 1404, while the EPD structure 204 in the bend region 1400 can be left as thin as possible to allow the EPD structure 204 to bend (or flex) over a tighter (i.e., smaller) radius when the EPD structure 204 is curved over the curved portion of the support frame.

Moreover, the first protective substrate 1414 does not extend into the bend region 1400 so as to avoid adding thickness to the bend region 1400. Because the third portion of the flexible backplane substrate 206 within the flat outer region 1404 is not bent (or flexed) (i.e., the third portion within the flat outer region 1404 remains substantially flat after manufacturing of the optical assembly 200), the added thickness of the first protective substrate 1414 does not inhibit the small radius of curvature enabled by the relatively thinner portion of the EPD structure 204 within the bend region 1400. Thus, the added protective substrate 1414 that is disposed on the back surface of the third portion of the flexible backplane substrate 206 within the flat outer region 1404 is a partial (i.e., not covering the entire back surface of the flexible backplane substrate 206), back support structure that protects the driver chip(s) 700 interface and the fan-out region 1410 that also leaves the bend region 1400 of the EPD structure 204 thin and flexible so that the EPD structure 204 can be wrapped around the support frame at a small radius of curvature to allow for a thinner device profile (as measured in the z-direction). The bend region 1400 is still robust due to the multiple layers (i.e., 206, 110, 112, and 114) within the bend region 1400 that constitute the EPD structure 204.

Figure 15:
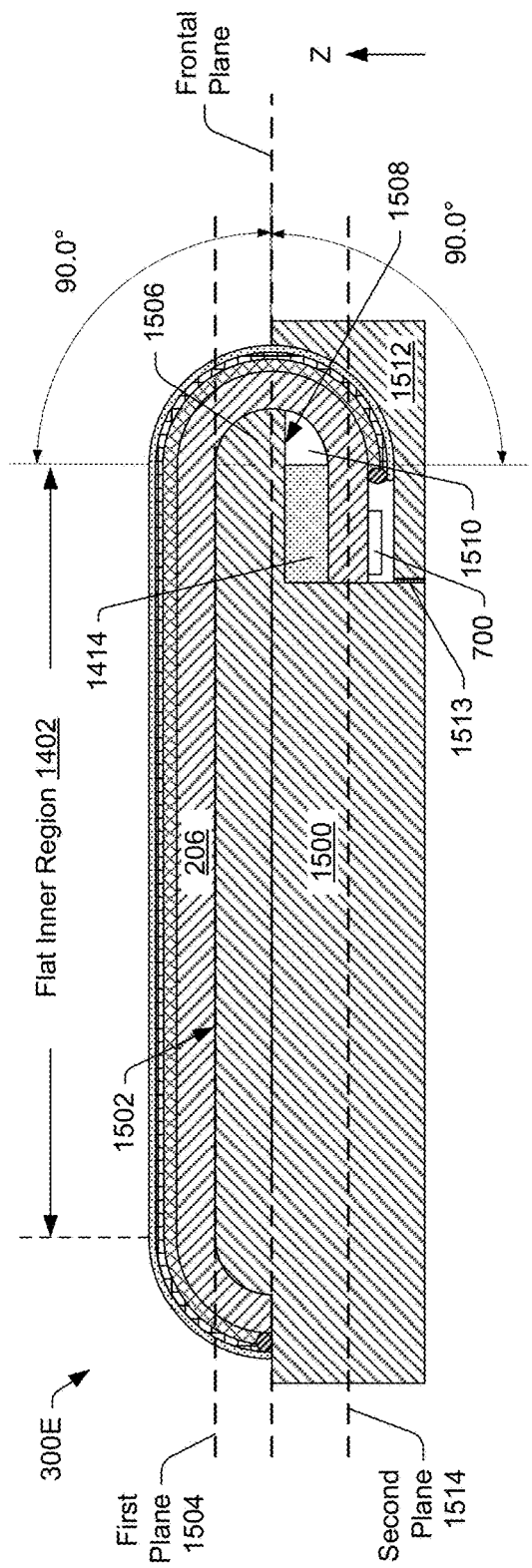
FIG. 15 illustrates a side, cross-sectional view of an example electronic device shown in FIG. 4 along section E-E, the electronic device having the electrophoretic display structure shown in FIG. 14B.

FIG. 15 illustrates a side, cross-sectional view of an example electronic device 300E shown in FIG. 4 along section E-E, the electronic device having the electrophoretic display structure 204 shown in FIG. 14B. For example, the electronic device 300E can represent a four-sided thin border display where the driver chip(s) 700 is positioned behind the portion of the flexible backplane substrate 206 within the flat inner region 1402.

The electronic device 300E may include a display stack that comprises a first support frame 1500 that is configured to support the EPD structure 204 of FIG. 14B. Thus, the EPD structure 204 of FIG. 14B may be attached to the first support frame 1500 as a result of manufacturing the optical assembly 200. The first support frame 1500 may have a flat (or planar) front surface 1502 at a center region of the first support frame 1500. The flat front surface 1502 can substantially span an area of the electronic device 300E in a plane parallel to an imaginary frontal plane that splits the electronic device 300E into front and back (rear) portions. In other words, the center region of the first support frame 1500 can comprise a region that extends from the center of the first support frame 1500 in all directions a particular distance towards the outermost edges of the first support frame 1500, but that ends a short distance from the outermost edges of the first support frame 1500. The flat front surface 1502 of the first support frame 1500 may be substantially flat and on a first plane 1504 that is parallel to the frontal plane. In some cases, "parallel" may mean coplanar, such that the first plane 1504 of the flat front surface 1502 can be parallel and coplanar with the frontal plane. Alternatively, the first plane 1504 can be spaced a distance in the z-direction from the frontal plane.

The first support frame 1500 may further include a curved portion 1506 at a periphery of the first support frame 1500. The curved portion 1506 being located at "a periphery" of the first support frame 1500 can mean that the apex of the curved portion 1506 is the outermost point on first support frame 1500 in a direction perpendicular to the z-direction. Alternatively, the curved portion 1506 being located at "a periphery" of the first support frame 1500 can mean that the curved portion 1506 is located near the outermost point on the first support frame 1500 in a direction perpendicular to the z-direction. In some configurations, the periphery of the first support frame 1500 can constitute an area within about 50 mm of the outermost point on the first support frame 1500 in a direction perpendicular to the z-direction. In some configurations, the first support frame 1500 does not have the curved portion 1506. In such a configuration, the second portion of the flexible backplane substrate 206 within the bend region 1400 can be curved around a 90 degree corner at an outer edge of the first support frame 1500 instead of being curved over the curved portion 1506. The curved portion 1506 may offer more support and rigidity to the display stack at the edge of the display stack.

The first support frame 1500 can also include a flat (planar) back surface 1508. The display stack shown in FIG. 15 can further comprise a second support frame 1512 that is attached to the first support frame 1500 at an attachment area 1513. The attachment area 1513 may mechanically couple the second support frame 1512 to the first support frame 1500 using any suitable fastener(s), such as screws, pins, notches, grooves, adhesive, and the like. The assembly with the second support frame 1512 attached to the first support frame 1500 leaves a space 1510 (or conduit) for the flexible backplane substrate 206 to extend to the back surface 1508 of the first support frame 1500 so that the third portion of the flexible backplane substrate 206 within the flat outer region 1404 can be disposed on the back surface 1508 of the first support frame 1500. In this configuration, the first protective substrate 1414 can be disposed on the flat back surface 1508 of the first support frame 1500.

As shown in FIG. 15, the first portion of the flexible backplane substrate 206 within the flat inner region 1402 may be disposed on, over, and/or in front of, the flat front surface 1502 of the first support frame 1500. The second portion of the flexible backplane substrate 206 within the bend region 1400 may be curved over the curved portion 1506 of the first support frame 1500, or curved around the first support frame 1500 regardless of whether the first support frame 1500 has the curved portion 1506 or omits the curved portion 1506. In some configurations, the curved, second portion of the flexible backplane substrate 206 within the bend region 1400 makes a turn of about 180 degrees where the second, curved portion of the flexible backplane substrate 206 transitions to the third portion of the flexible backplane substrate 206 within the flat outer region 1404 that is substantially flat, disposed on the back surface 1508 of the first support frame 1500, and oriented on a second plane 1514 that is parallel to, and behind (or underneath), the first plane 1504 on which the flat front surface 1502 is situated.

It is to be appreciated that, in the configuration of FIG. 15, the driver chip(s) 700 is still considered to be disposed (e.g., mounted) on the front surface of the third portion of the flexible backplane substrate 206 even though the front surface of the flexible backplane substrate 206 at the third portion of the flexible backplane substrate 206 within the flat outer region 1404 is facing the negative z-direction. The fact that the flexible backplane substrate 206 is wrapped around the first support frame 1500 so that the front surface of the flexible backplane substrate 206 at the third portion of the flexible backplane substrate 206 within the flat outer region 1404 is facing the negative z-direction does not change the fact that the driver chip(s) 700 is mounted on the front surface of the third portion of the flexible backplane substrate 206; the third portion of the flexible backplane substrate 206 has simply been turned over during manufacturing so that the front surface faces the opposite (negative z) direction. Similarly, the additional protective substrate 1414 shown in FIG. 15 is still considered to be disposed on the back surface of the flexible backplane substrate 206 at the third portion of the flexible backplane substrate 206 within the flat outer region 1404 notwithstanding its orientation facing in the positive z-direction after manufacturing.

FIG. 15 further illustrates additional layers of the EPD structure 204 disposed on the flexible backplane substrate 206 within at least the flat inner region 1402 and the bend region 1400. These additional layers can comprise the electrophoretic layer 110, the transparent conductive layer 112, and the transparent protective substrate 114 described herein. These additional layers of the EPD structure 204, in some configurations, can extend partially into the flat outer region 1404 (e.g., up to the edge seal 122 and/or the fan-out region 1410). Wrapping the driver chip(s) 700 around the first support frame 1500 in the manner shown in FIG. 15 can make the display of the electronic device 300E appear borderless on one or more sides thereof, and/or one or more of the top or bottom of the electronic device 300E. Furthermore, the first protective substrate 1414 protects the sensitive fan-out region 1410 and/or the sensitive interface under the driver chip(s) 700 from damage during manufacture, while leaving the EPD structure 204 in the bend region 1400 relatively thin and flexible to accommodate a thin profile for the electronic device 300E, as measured in the z-direction.

Figure 16:
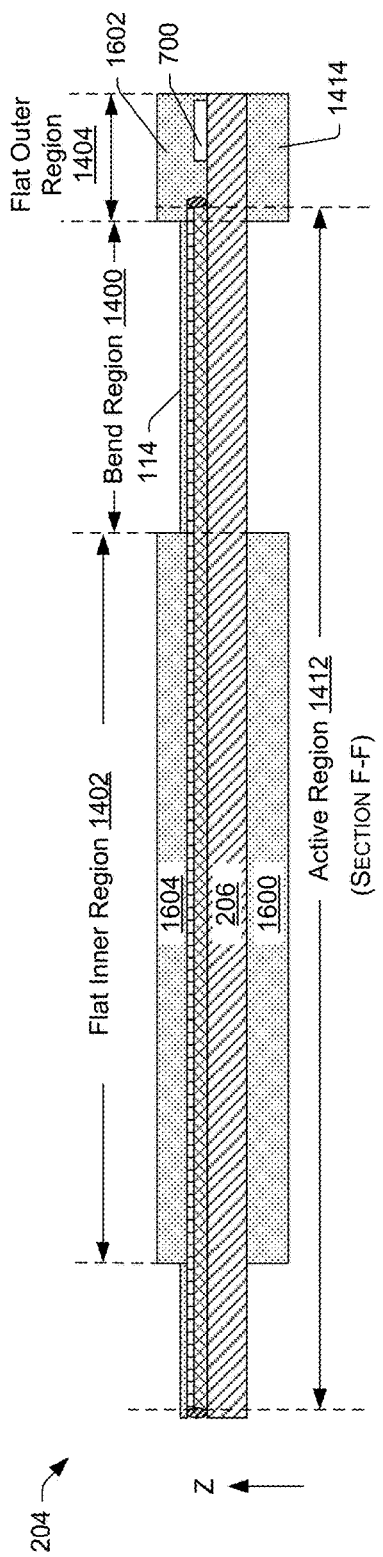
FIG. 16 illustrates a side, cross-sectional view of the example electrophoretic display structure of FIG. 14A along section F-F according to another embodiment.

FIG. 16 illustrates a side, cross-sectional view of the example electrophoretic display (EPD) structure 204 of FIG. 14A along section F-F according to another embodiment. Notably, the EPD structure 204 of FIG. 16 includes additional protective substrates in addition to the first protective substrate 1414 and the transparent protective substrate 114 described with reference to FIGS. 14A, 14B, and 15. For example, the EPD structure 204 may further include a second protective substrate 1600 that is disposed on the back surface of the flexible backplane substrate 206 at the first portion of the flexible backplane substrate 206 within the flat inner region 1402. The second protective substrate 1600 can be made of the same, or a similar, material to that of the first protective substrate 1414, and may be of a similar thickness to that of the first protective substrate 1414. For example, the second protective substrate 1600 can be of the same thickness as the first thickness, T, of the first protective substrate 1414 in order to substantially planarize the back of the EPD structure 204. However, the thickness of the second protective substrate 1600 can alternatively be greater than, or less than, the thickness, T, of the first protective substrate 1414. Moreover, the second protective substrate 1600 may span all or part of the first portion of the flexible backplane substrate 206 within the flat inner region 1402.

The EPD structure 204 can further include a third protective substrate 1602 that is disposed on the front surface of the third portion of the flexible backplane substrate 206 within the flat outer region 1404, and atop the driver chip(s) 700. The third protective substrate 1602 can be made of the same, or a similar, material to that of the first protective substrate 1414, and may be of a similar thickness to that of the first protective substrate 1414. For example, the third transparent protective substrate 1602 can be of the same thickness as the first thickness, T, of the first protective substrate 1414. However, the thickness of the third protective substrate 1602 can alternatively be greater than, or less than, the thickness, T, of the first protective substrate 1414. Moreover, the third protective substrate 1602 may span all or part of the third portion of the flexible backplane substrate 206 within the flat outer region 1404. It is to be appreciated that the third protective substrate 1602 can be transparent at portion of the EPD structure 204 within the active region 1412, but this is also not a limitation because part of the active region 1412 can be wrapped around the support frame such that part of the active region 1412 is not used for a viewable portion of the display. In some configurations, however, the entire active region 1412 will be used as a viewable portion of the display, in which case, any protective substrate (e.g., the third protective substrate 1602) that is disposed over, or in front of, the flexible backplane substrate 206 within the active region 1412 can be made of a transparent material to allow for light to travel through the protective substrate 1602.

The EPD structure 204 can further include a second transparent protective substrate 1604 that is disposed on the front surface of the first portion of the flexible backplane substrate 206 within the flat inner region 1402. It is to be appreciated that the second transparent protective substrate 1604 can replace the relatively thinner (first) transparent protective substrate 114 within the flat inner region 1402. In configurations that do not include the second transparent protective substrate 1604, however, a thinner transparent protective substrate 114 (e.g., of the relative thickness shown in the bend region 1400 of FIG. 16) can be disposed on transparent conductive layer 112 within the flat inner region 1402 to afford at least some protection of the layers within the active region 1412 on the front of the flexible backplane substrate 206. The second transparent protective substrate 1604 can be made of the same, or a similar, material to that of the first protective substrate 1414, and may be of a similar thickness to that of the first protective substrate 1414. For example, the second transparent protective substrate 1604 can be of the same thickness as the first thickness, T, of the first protective substrate 1414. In some configurations, the thickness of the second transparent protective substrate 1604 may be the same as the thickness of the third protective substrate 1602 in order to substantially planarize the front of the EPD structure 204. The thickness of the second transparent protective substrate 1604 can alternatively be greater than, or less than, the thickness, T, of the first protective substrate 1414. Moreover, the second transparent protective substrate 1604 may span all or part of the first portion of the flexible backplane substrate 206 within the flat inner region 1402. Accordingly, the material of the second transparent protective substrate 1604 can be transparent to allow for light to travel through the second transparent protective substrate 1604 so as to not obstruct the viewable portion of the display.

Figure 17:
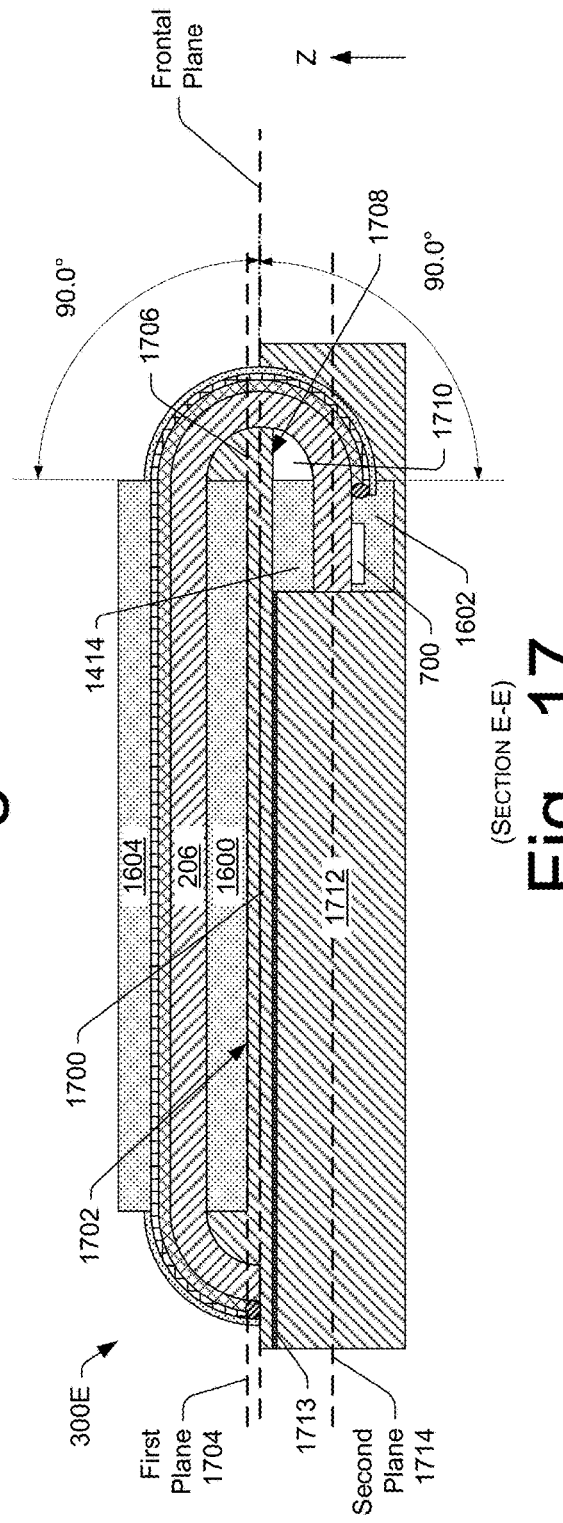
FIG. 17 illustrates a side, cross-sectional view of an example electronic device shown in FIG. 4 along section E-E, the electronic device having the electrophoretic display structure shown in FIG. 16.

FIG. 17 illustrates a side, cross-sectional view of an example electronic device 300E shown in FIG. 4 along section E-E, the electronic device 300E having the electrophoretic display structure 204 shown in FIG. 16. For example, the electronic device 300E shown in FIG. 17 can represent a four-sided thin border display where the driver chip(s) 700 is positioned behind the portion of the flexible backplane substrate 206 within the flat inner region 1402.

The electronic device 300E may include a display stack that comprises a first support frame 1700 that is configured to support the EPD structure 204 of FIG. 16. Thus, the EPD structure 204 of FIG. 16 may be attached to the first support frame 1700 as a result of manufacturing the display stack. The first support frame 1700 may have a flat (planar) front surface 1702 at a center region of the first support frame 1700 and substantially spanning an area of the electronic device 300E with respect to a plane parallel to the imaginary frontal plane of the electronic device 300E. In other words, the center region can comprise a region that extends from the center of the first support frame 1700 in all directions a particular distance towards the outermost edges of the first support frame 1700, but that ends a short distance from the outermost edges of the first support frame 1700. The flat front surface 1702 of the first support frame 1700 may be substantially flat and on a first plane 1704 that is parallel to the frontal plane. Again, "parallel" may mean coplanar, in some instances, such that the first plane 1704 of the flat front surface 1702 can be parallel and coplanar with the frontal plane. Alternatively, the first plane 1704 can be spaced a distance in the z-direction from the frontal plane.

The first support frame 1700 may further include a curved portion 1706 at a periphery of the first support frame 1700. What constitutes being located at the periphery of the first support frame 1700 can be similar to the description of the curved portion 1506 of the first support frame 1500 described with reference to FIG. 15. Furthermore, the curved portion 1706 can be omitted from the first support frame 1700 such that the curved, second portion of the flexible backplane substrate 206 within the bend region 1400 can be curved around a 90 degree corner at an outer edge of the first support frame 1700 instead of being curved over the curved portion 1706.

The first support frame 1700 can also include a flat (planar) back surface 1708. The display stack shown in FIG. 17 can further comprise a second support frame 1712 that is attached to the first support frame 1700 at an attachment area 1713. The attachment area 1713 may mechanically couple the second support frame 1712 to the first support frame 1700 using any suitable fastener(s), such as screws, pins, notches, grooves, adhesive, and the like. It is to be appreciated that the first support frame 1700 and the second support frame 1712 can be in a configuration that is similar to the first support frame 1500 and the second support frame 1512 shown in FIG. 15 where the attachment area 1513 is vertically oriented and located near the location of the driver chip 700, as opposed to the horizontally oriented attachment area 1713 of FIG. 17, and vice versa. The assembly with the second support frame 1712 attached to the first support frame 1700 leaves a space 1710 (or conduit) for flexible backplane substrate 206 to extend to the back surface 1708 of the first support frame 1700 so that the third portion of the flexible backplane substrate 206 within the flat outer region 1404 can be disposed on the back surface 1708 of the first support frame 1700. In this configuration, the first protective substrate 1414 can be disposed on the flat back surface 1708 of the first support frame 1700.

As shown in FIG. 17, the first portion of the flexible backplane substrate 206 within the flat inner region 1402 may be disposed over, or in front of, the flat front surface 1702 of the first support frame 1700. In the configuration where the EPD structure 204 includes the second protective substrate 1600, the second protective substrate 1600 can be disposed on the flat front surface 1702 of the first support frame 1700. The second portion of the flexible backplane substrate 206 within the bend region 1400 may be curved around (e.g., over the curved portion 1706 of) the first support frame 1700. In some configurations, the curved, second portion of the flexible backplane substrate 206 within the bend region 1400 makes a turn of about 180 degrees where the second, curved portion of the flexible backplane substrate 206 transitions to the third portion of the flexible backplane substrate 206 within the flat outer region 1404 that is substantially flat, disposed on the flat back surface 1708 of the first support frame 1700, and oriented on a second plane 1714 that is parallel to, and behind (or underneath), the first plane 1704 on which the flat front surface 1702 is situated.

By including one or more of the additional protective substrates 1600, 1602, and 1604 shown in FIGS. 16 and 17, the EPD structure 204 can be made more robust and can further protect the underlayers, such as the flexible backplane substrate 206, from damage.

CONCLUSION

Although the subject matter has been described in language specific to structural features, it is to be understood that the subject matter defined in the appended claims is not necessarily limited to the specific features described. Rather, the specific features are disclosed as illustrative forms of implementing the claims.

What is claimed is:

1. A display stack for a display of an electronic device, the display stack comprising:
   a support frame having:
      a flat front surface at a center region of the support frame;
      a curved portion at a periphery of the support frame; and
      a flat back surface opposite the flat front surface; and
   an electrophoretic display structure attached to the support frame, the electrophoretic display structure comprising:
      a flexible thin film transistor (TFT) array substrate having a front surface and a back surface opposite the front surface of the flexible TFT array substrate, wherein:
         a first portion of the flexible TFT array substrate is disposed on the flat front surface of the support frame;
         a second portion of the flexible TFT array substrate is wrapped around the curved portion of the support frame; and
         a third portion of the flexible TFT array substrate is disposed on the flat back surface of the support frame;
      a driver chip mounted on the front surface of the flexible TFT array substrate at the third portion of the flexible TFT array substrate;
      a protective substrate disposed on the back surface of the flexible TFT array substrate at the third portion of the flexible TFT array substrate;
      an electrophoretic layer disposed on the flexible TFT array substrate and spanning the first and the second portions of the flexible TFT array substrate;
      a transparent conductive layer disposed on the electrophoretic layer and spanning the first and the second portions of the flexible TFT array substrate; and
      a transparent protective substrate disposed on the transparent conductive layer and spanning the first and the second portions of the flexible TFT array substrate.

2. The display stack of claim 1, wherein:
   the protective substrate has a first thickness and the transparent protective substrate has a second thickness; and
   the first thickness is greater than the second thickness.

3. The display stack of claim 1, wherein the protective substrate is a first protective substrate, the electrophoretic display structure further comprising a second protective substrate disposed on the back surface of the flexible TFT array substrate and spanning the first portion of the flexible TFT array substrate.

4. The display stack of claim 1, wherein the protective substrate is a first protective substrate, the electrophoretic display structure further comprising a second protective substrate disposed on the front surface of the flexible TFT array substrate atop the driver chip and spanning the third portion of the flexible TFT array substrate.

5. A display stack comprising:
 a support frame having a planar front surface at a center region of the support frame and a planar back surface opposite the planar front surface; and
 an electrophoretic display structure attached to the support frame, the electrophoretic display structure comprising:
  a flexible backplane substrate having:
   a front surface;
   a back surface opposite the front surface of the flexible backplane substrate;
   a first portion disposed on the planar front surface of the support frame;
   a second portion disposed between the first portion and a third portion of the flexible backplane substrate, wherein the second portion connects the first portion to the third portion, and wherein the second portion is curved; and
   the third portion disposed on the planar back surface of the support frame;
  an electrophoretic layer disposed on the flexible backplane substrate at the first portion and the second portion;
  a driver chip disposed on the front surface of the flexible backplane substrate at the third portion; and
  a protective substrate disposed on the back surface of the flexible backplane substrate at the third portion.

6. The display stack of claim 5, wherein the protective substrate has a first thickness, the electrophoretic display structure further comprising:
 a transparent protective substrate disposed on the electrophoretic layer at the second portion and having a second thickness, wherein the first thickness is greater than the second thickness.

7. The display stack of claim 6, wherein the first thickness is at least about 200 microns, and the second thickness is no greater than about 50 microns.

8. The display stack of claim 6, the electrophoretic display structure further comprising a transparent conductive layer disposed between the electrophoretic layer and the transparent protective substrate at the first portion and the second portion.

9. The display stack of claim 5, wherein the support frame further comprises:
 a curved portion at a periphery of the support frame, wherein the back surface of the flexible backplane substrate at the second portion is disposed over the curved portion of the support frame.

10. The display stack of claim 5, wherein the protective substrate is a first protective substrate, the electrophoretic display structure further comprising a second protective substrate disposed on the back surface of the flexible backplane substrate at the first portion.

11. The display stack of claim 5, wherein the electrophoretic layer spans the first portion and the second portion.

12. The display stack of claim 5, wherein the protective substrate is a first protective substrate, the electrophoretic display structure further comprising:
 a second protective substrate disposed on the front surface of the flexible backplane substrate atop the driver chip at the third portion.

13. The display stack of claim 10, wherein the first protective substrate has a first thickness, and wherein the second protective substrate has a second thickness that is substantially equal to the first thickness.

14. A display stack comprising:
 a support frame having a front surface and a back surface opposite the front surface of the support frame; and
 an electrophoretic display structure attached to the support frame, the electrophoretic display structure comprising:
  a flexible backplane substrate having:
   a front surface;
   a back surface opposite the front surface of the flexible backplane substrate;
   a flat first portion disposed on the front surface of the support frame;
   a curved second portion disposed between the flat first portion and a flat third portion of the flexible backplane substrate, wherein the curved second portion connects the flat first portion to the flat third portion; and
   the flat third portion disposed on the back surface of the support frame;
  an electrophoretic layer disposed on the front surface of the flexible backplane substrate at the flat first portion and the curved second portion;
  a driver chip disposed on the front surface of the flexible backplane substrate at the flat third portion; and
  a protective substrate disposed on the back surface of the flexible backplane substrate at the flat third portion.

15. The display stack of claim 14, wherein the protective substrate is a first protective substrate, the electrophoretic display structure further comprising a second protective substrate disposed on the back surface of the flexible backplane substrate at the flat first portion.

16. The display stack of claim 15, wherein the first protective substrate has a first thickness, and wherein the second protective substrate has a second thickness that is substantially equal to the first thickness.

17. The display stack of claim 14, wherein the protective substrate is a first protective substrate, the electrophoretic display structure further comprising a second protective substrate disposed on the front surface of the flexible backplane substrate atop the driver chip at the flat third portion.

18. The display stack of claim 14, wherein the protective substrate has a first thickness, the electrophoretic display structure further comprising:
 a transparent protective substrate disposed on the electrophoretic layer at the curved second portion and having a second thickness, wherein the first thickness is greater than the second thickness.

19. The display stack of claim 18, the electrophoretic display structure further comprising a transparent conductive layer disposed between the electrophoretic layer and the transparent protective substrate at the flat first portion and the curved second portion.

20. The display stack of claim 14, wherein the support frame further comprises:

a curved portion at a periphery of the support frame, wherein the back surface of the flexible backplane substrate at the curved second portion is disposed over the curved portion of the support frame.

* * * * *